US010965065B2

(12) United States Patent
Cartier, Jr. et al.

(10) Patent No.: US 10,965,065 B2
(45) Date of Patent: Mar. 30, 2021

(54) INSULATIVE SUPPORT FOR VERY HIGH SPEED ELECTRICAL INTERCONNECTION

(71) Applicant: Amphenol Corporation, Wallingford, CT (US)

(72) Inventors: Marc B. Cartier, Jr., Dover, NH (US); John Robert Dunham, Windham, NH (US); Vysakh Sivarajan, Nashua, NH (US); Mark W. Gailus, Concord, MA (US); David Levine, Amherst, NH (US); Michael Joseph Snyder, Merrimack, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/806,402

(22) Filed: Mar. 2, 2020

(65) Prior Publication Data

US 2020/0203893 A1    Jun. 25, 2020

Related U.S. Application Data

(63) Continuation of application No. 16/358,143, filed on Mar. 19, 2019, now Pat. No. 10,581,203.
(Continued)

(51) Int. Cl.
*H01R 13/648* (2006.01)
*H01R 13/6582* (2011.01)
(Continued)

(52) U.S. Cl.
CPC ....... *H01R 13/6582* (2013.01); *H01R 12/722* (2013.01); *H01R 13/6587* (2013.01); *H05K 1/145* (2013.01)

(58) Field of Classification Search
CPC .............. H01R 12/722; H01R 13/6582; H01R 13/6587; H05K 1/145
(Continued)

(56) References Cited

U.S. PATENT DOCUMENTS 4,635,476 A    1/1987 Haynes
4,806,107 A    2/1989 Arnold et al.
(Continued)

OTHER PUBLICATIONS

International Search Report and Written Opinion for International Application No. PCT/US2019/022934, dated Jul. 4, 2019.

*Primary Examiner* — Abdullah A Riyami
*Assistant Examiner* — Vladimir Imas
(74) *Attorney, Agent, or Firm* — Wolf, Greenfield & Sacks, P.C.

(57) ABSTRACT

An electrical connector module with openings in an insulative support selectively positioned to limit dielectric loss in a signal. The connector may include a first and second conductor including first and second sides between first and second edges. An insulative support holds the first conductor adjacent the second conductor and may have at least five pedestal portions, wherein the first pedestal portion contacts the first side of the first conductor, the second pedestal portion contacts the second side of the first conductor, the third pedestal portion contacts the first side of the second conductor, the fourth pedestal portion contacts the second side of the second conductor, and at least a portion of the fifth pedestal portion is disposed between two edges of the first and second conductors. The pedestal portions may have widths less than the widths of the first and second sides of the first and second conductors.

20 Claims, 26 Drawing Sheets

Related U.S. Application Data

(60) Provisional application No. 62/776,349, filed on Dec. 6, 2018, provisional application No. 62/647,517, filed on Mar. 23, 2018.

(51) Int. Cl.
*H05K 1/14* (2006.01)
*H01R 12/72* (2011.01)
*H01R 13/6587* (2011.01)

(58) Field of Classification Search
USPC .................................................. 439/607.35
See application file for complete search history.

(56) References Cited

U.S. PATENT DOCUMENTS

| | | |
|---|---|---|
| 4,846,727 A | 7/1989 | Glover et al. |
| 4,917,616 A | 4/1990 | Demler, Jr. et al. |
| 4,975,084 A | 12/1990 | Fedder et al. |
| 5,015,200 A | 5/1991 | Abernethy |
| 5,066,236 A | 11/1991 | Broeksteeg |
| 5,429,520 A | 7/1995 | Morlion et al. |
| 5,429,521 A | 7/1995 | Morlion et al. |
| 5,433,617 A | 7/1995 | Morlion et al. |
| 5,433,618 A | 7/1995 | Morlion et al. |
| 5,484,310 A | 1/1996 | McNamara et al. |
| 5,496,183 A | 3/1996 | Soes et al. |
| 5,634,822 A | 6/1997 | Gunell |
| 6,015,304 A | 1/2000 | Yagi |
| 6,036,500 A | 3/2000 | Francis |
| 6,293,827 B1 | 9/2001 | Stokoe |
| 6,299,438 B1 | 10/2001 | Sahagian et al. |
| 6,503,103 B1 | 1/2003 | Cohen et al. |
| 6,672,893 B1 | 1/2004 | Sedlecky |
| 6,776,659 B1 | 8/2004 | Stokoe et al. |
| 6,793,540 B2 | 9/2004 | Peng |
| 7,163,421 B1 | 1/2007 | Cohen et al. |
| 7,351,117 B1 | 4/2008 | Mostoller |
| 7,549,868 B1 | 6/2009 | Ho |
| 7,794,278 B2 | 9/2010 | Cohen et al. |
| 7,985,097 B2 | 7/2011 | Gulla |
| 8,734,173 B2 | 5/2014 | Suzuki |
| 9,004,928 B2 | 4/2015 | Tanaka |
| 9,831,608 B1 * | 11/2017 | Pickel ................ H01R 13/6471 |
| 10,141,676 B2 * | 11/2018 | Astbury ............... H01R 12/716 |
| 10,170,869 B2 * | 1/2019 | Gailus ................ H01R 12/7076 |
| 10,243,310 B1 | 3/2019 | Monahan |
| 10,305,224 B2 * | 5/2019 | Girard, Jr. ........... H01R 13/629 |
| 10,581,203 B2 * | 3/2020 | Cartier, Jr. ........... H01R 12/722 |
| 2005/0233610 A1 | 10/2005 | Tutt et al. |
| 2013/0109232 A1 | 5/2013 | Paniaqua |
| 2013/0183869 A1 | 7/2013 | Minich et al. |
| 2013/0288525 A1 | 10/2013 | McClellan et al. |
| 2015/0236452 A1 | 8/2015 | Cartier, Jr. et al. |
| 2016/0344141 A1 * | 11/2016 | Cartier, Jr. ............ H01R 43/24 |
| 2017/0005445 A1 | 1/2017 | Resendez et al. |
| 2019/0296496 A1 | 9/2019 | Cartier, Jr. et al. |

\* cited by examiner

INSULATIVE SUPPORT FOR VERY HIGH SPEED ELECTRICAL INTERCONNECTION

CROSS REFERENCE TO RELATED APPLICATIONS

This application is a Continuation of U.S. application Ser. No. 16/358,143, filed Mar. 19, 2019, entitled "INSULATIVE SUPPORT FOR VERY HIGH SPEED ELECTRICAL INTERCONNECTION", which claims priority to and the benefit of U.S. Provisional Patent Application Ser. No. 62/647,517, filed Mar. 23, 2018, and entitled "INSULATIVE SUPPORT FOR VERY HIGH SPEED ELECTRICAL INTERCONNECTION," and this application also claims priority to and the benefit of U.S. Provisional Patent Application Ser. No. 62/776,349, filed Dec. 6, 2018 and entitled "INSULATIVE SUPPORT FOR VERY HIGH SPEED ELECTRICAL INTERCONNECTION," which are hereby incorporated herein by reference in their entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughterboards" or "daughtercards," may be connected through the backplane.

A known backplane is a printed circuit board onto which many connectors may be mounted. Conducting traces in the backplane may be electrically connected to signal conductors in the connectors so that signals may be routed between the connectors. Daughtercards may also have connectors mounted thereon. The connectors mounted on a daughtercard may be plugged into the connectors mounted on the backplane. In this way, signals may be routed among the daughtercards through the backplane. The daughtercards may plug into the backplane at a right angle. The connectors used for these applications may therefore include a right angle bend and are often called "right angle connectors."

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughterboards. Also, boards of the same size or similar sizes may sometimes be aligned in parallel. Connectors used in these applications are often called "stacking connectors" or "mezzanine connectors."

Regardless of the exact application, electrical connector designs have been adapted to mirror trends in the electronics industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In a high density, high speed connector, electrical conductors may be so close to each other that there may be electrical interference between adjacent signal conductors. To reduce interference, and to otherwise provide desirable electrical properties, shield members are often placed between or around adjacent signal conductors. The shields may prevent signals carried on one conductor from creating "crosstalk" on another conductor. The shield may also impact the impedance of each conductor, which may further contribute to desirable electrical properties.

Examples of shielding can be found in U.S. Pat. Nos. 4,632,476 and 4,806,107, which show connector designs in which shields are used between columns of signal contacts. These patents describe connectors in which the shields run parallel to the signal contacts through both the daughterboard connector and the backplane connector. Cantilevered beams are used to make electrical contact between the shield and the backplane connectors. U.S. Pat. Nos. 5,433,617, 5,429,521, 5,429,520, and 5,433,618 show a similar arrangement, although the electrical connection between the backplane and shield is made with a spring type contact. Shields with torsional beam contacts are used in the connectors described in U.S. Pat. No. 6,299,438. Further shields are shown in U.S. Pre-grant Publication 2013-0109232.

Other connectors have shield plates within only the daughterboard connector. Examples of such connector designs can be found in U.S. Pat. Nos. 4,846,727, 4,975,084, 5,496,183, and 5,066,236. Another connector with shields only within the daughterboard connector is shown in U.S. Pat. Nos. 5,484,310, 7,985,097 is a further example of a shielded connector.

Other techniques may be used to control the performance of a connector. For instance, transmitting signals differentially may also reduce crosstalk. Differential signals are carried on a pair of conducting paths, called a "differential pair." The voltage difference between the conductive paths represents the signal. In general, a differential pair is designed with preferential coupling between the conducting paths of the pair. For example, the two conducting paths of a differential pair may be arranged to run closer to each other than to adjacent signal paths in the connector. No shielding is desired between the conducting paths of the pair, but shielding may be used between differential pairs. Electrical connectors can be designed for differential signals as well as for single-ended signals. Examples of differential electrical connectors are shown in U.S. Pat. Nos. 6,293,827, 6,503,103, 6,776,659, 7,163,421, and 7,794,278.

SUMMARY

Aspects of the present disclosure are related to an electrical connector configured to reduce dielectric loss.

According to one aspect of the present application, an electrical connector module is provided. The electrical connector module includes: at least two conductors, each of the at least two conductors including: a first end and a second end, and an intermediate portion connecting the first end and the second end, the intermediate portion comprising a first edge and a second edge and a first side and a second side between the first edge and the second edge, the first and second sides being wider than the first and second edges, wherein the at least two conductors comprise a first conductor and a second conductor; and an insulative support holding the first conductor adjacent the second conductor, the insulative support having a first pedestal portion, a second pedestal portion, a third pedestal portion and a fourth pedestal portion, wherein the first pedestal portion contacts the first side of the first conductor, the second pedestal portion contacts the second side of the first conductor, the third pedestal portion contacts the first side of the second conductor, and the fourth pedestal portion contacts the second side of the second conductor, and, wherein the first pedestal portion and the fourth pedestal portions have widths less than the widths of the first and second sides of the first and second conductors.

According to one aspect of the present application, an electrical connector is provided. The electrical connector includes: a plurality of signal conductors, wherein the signal conductors are configured to produce an electric field pattern when carrying a low voltage differential signal at a frequency of 40 GHz, the field pattern defining regions of higher and lower electric field strength; and insulative material holding the plurality of signal conductors, wherein the insulative material includes a plurality of openings along at least a portion of a length of signal conductors of the plurality of signal conductors, wherein the openings are selectively positioned with respect to regions of the higher electric field strength such that dielectric loss exhibited by a 14 GHz 50 millivolt differential signal is at least 10% less in comparison to an insulative housing without openings.

According to one aspect of the present application, a method of manufacturing a module for an electrical connector is provided. The method includes: positioning a central member of an insulative support between at least two conductors, each of the at least two conductors comprising: a first end and a second end; and an intermediate portion connecting the first end and the second end, the intermediate portion comprising a first edge and a second edge and a first side and a second side between the first edge and the second edge, the first and second sides being wider than the first and second edges, wherein the at least two conductors comprise a first conductor and a second conductor, and the central member comprising a first pedestal portion and a second pedestal portion, wherein the first pedestal portion contacts the first side of the first conductor and the second pedestal portion contacts the first side of the second conductor; positioning a first cover and a second cover of the insulative support adjacent to the first conductor and the second conductor respectively, each of the first and second cover comprising a respective pedestal portion, wherein the pedestal portion of the first cover contacts the second side of the first conductor and the pedestal portion of the second cover contacts the second side of the second conductor, and wherein a portion of at least one surface of each conductor is exposed within an opening between the central member and a cover of the first and the second cover; and surrounding at least a portion of the covers and the central member with one or more reference conductors.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
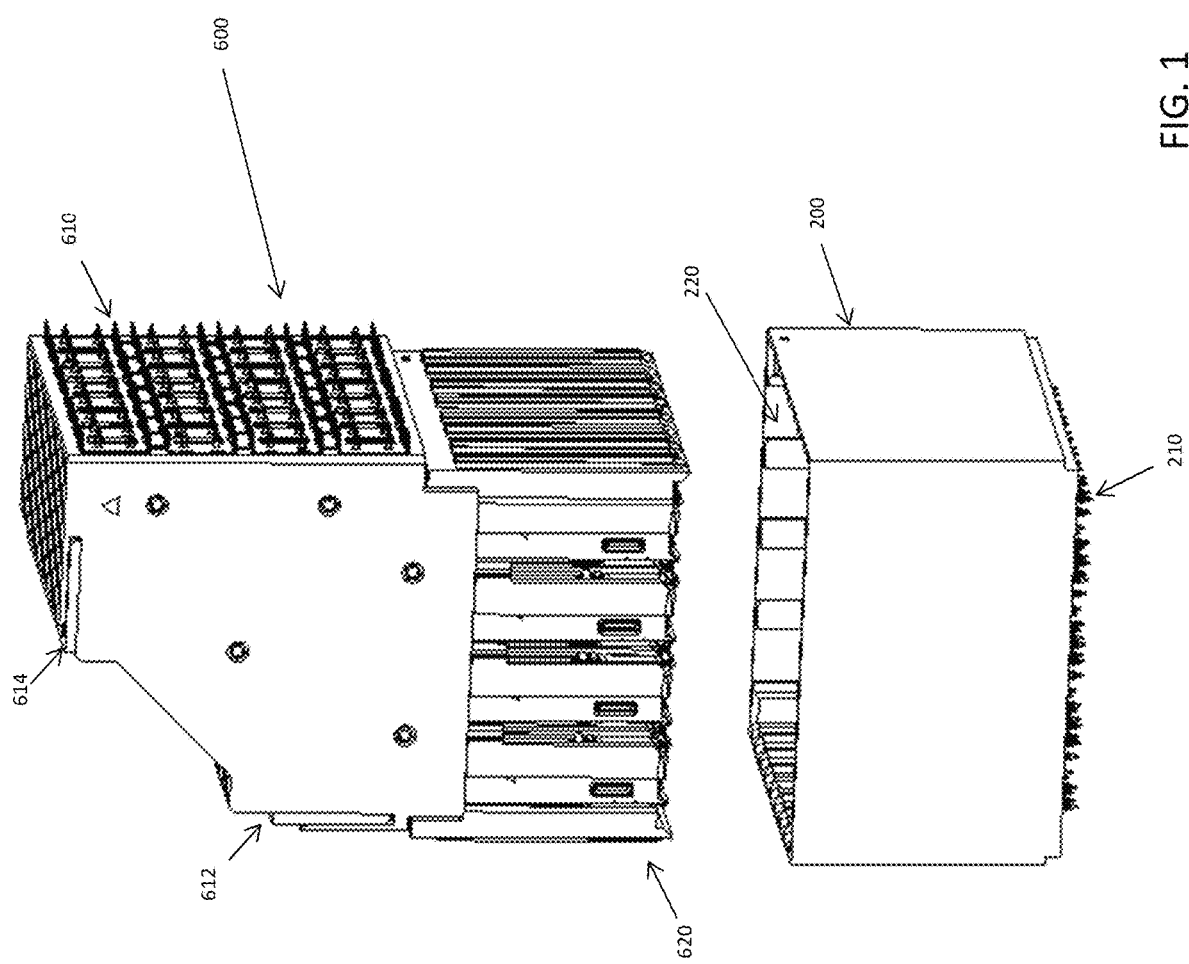
FIG. 1 is an isometric view of an illustrative electrical interconnection system, in accordance with some embodiments.

The inventors have recognized and appreciated techniques for increasing the performance of a high density interconnection system, particularly those that carry very high frequency signals that are necessary to support high data rates, by selectively positioning dielectric material adjacent signal conductors so as to limit dielectric loss. Due to the geometry of signal conductors, high frequency signals being carried on signal conductors may create an electric field with spatially variable intensity. Where the electric field interacts with dielectric material supporting the signal conductors, there may be substantial dielectric loss experienced by a high frequency, e.g. 14, 24 or 40 GHz, signal. This dielectric loss may be mitigated by removing dielectric material at select locations near the signal conductors. In accordance with some embodiments, dielectric material may be omitted adjacent edges of the signal conductors. The inventors have recognized and appreciated that, in some embodiments, these regions contain higher electric field intensity.

The inventors have further recognized and appreciated techniques for stably retaining the signal conductors despite regions of omitted dielectric material. In accordance with some embodiments, the signal conductors may be suspended in one or more openings in the dielectric material. The openings may be defined by and/or abut one or more pedestals in the dielectric material that is coupled to the signal conductor. The dielectric material may comprise a plurality of members, forming an insulative support for the signal conductors of a pair.

In some embodiments, one or more other members may encircle the plurality of insulative members, pushing them together such that the signal conductors are pinched between the pedestal portions. In some embodiments, the members encircling the insulative support may be metal and, in some embodiments, may be grounded and may act as a shield for the pair of signal conductors. Multiple encircling members may collectively encircle each insulative support and those multiple encircle members may be held together with latches or insulative structures. In some embodiments, corners of the insulative members may be relieved so as to reduce variation in the pressure imposed on the insulative members by the encircling members.

Open areas on the insulative support adjacent the edges of broadside coupled signal conductors are believed to reduce the insertion loss of the connector by, in some embodiments, 10-15% at frequencies such as 14 GHz relative to a connector without open areas when the connector carries a low voltage differential signal, such as a 25 mV, 50 mV, 100 mV, 250 mV, or 500 mV low voltage differential signal. The difference in attenuation may be 15-20% at 24 GHz, and even greater at higher frequencies.

In some embodiments, an electrical connector module may be manufactured to include at least two conductors and an insulative support holding the conductors between pedestal portions. Each of the first to conductors may include first and second ends connected by an intermediate portion, with the intermediate portion having two sides and two edges that are narrower than the sides. The insulative support may have at least four pedestal portions, with pair of pedestal portions contacting respective sides of each of the at least two conductors. At least two of the pedestal portions may have widths less than the widths of the sides of the conductors.

In some embodiments, the insulative support comprises openings, and edges of the conductors are disposed within the openings. In some embodiments, the sides of the conductors have a first width, and the edges of the conductors each extend into the openings by a distance equal to at least 10% of the first width. In some embodiments, the first surface and the second surface of the first conductor and the second conductor are exposed within the openings.

In some embodiments, the conductors are held within the insulative support with the sides of the conductor being parallel. In some embodiments, the insulative support includes a first cover including a first pedestal portion, a central member including a second pedestal portion and a third pedestal portion, and a second cover including a fourth pedestal portion. In some embodiments, one or both cover(s) include a compliant portion between a first end and a second end, the first end and the second end of the cover(s) contact the central member, and a pedestal portion extends from the compliant portion.

In some embodiments, the electrical connector module includes at least one shield around the insulative support, the at least one shield pressing the compliant portion of a cover towards the central member such that a first conductor is pinched between the first pedestal portion and the second pedestal portion. In some embodiments, the at least one shield comprises at least one metal member. In some embodiments, the at least one metal member comprises two joined metal members that collectively encircle the insulative support. In some embodiments, two shield members collectively encircle the insulative support. In some embodiments, the conductors are a broadside coupled pair of signal conductors and the shield is disposed around the broadside coupled pair. In some embodiments, first ends of the signal conductors comprise mating contact portions, second ends of the first and second signal conductors comprise contact tails, and the mating contact portions and the contact tails extend from the insulative support. In some embodiments, the at least one of the covers comprises a first side and an opposing side, the first pedestal portion extends from a central portion of the first side, portions of the opposing side contact the shield, and a central portion of the opposing side comprises a groove, creating a space between the central portion and the shield.

In some embodiments, corners of the first end and the second end of the at least one cover are relieved so as the leave a space between the corners and the at least one shield. In some embodiments, a subassembly includes at least two conductors, an insulative support, a first shield member, and a second shield member, and the electrical connector module includes a wafer. The wafer may include multiple lossy members coupled to the first shield member and/or the second shield member of at least one of a plurality of subassemblies disposed within the wafer. In some embodiments, a plurality of wafers are aligned in parallel to form an electrical connector.

In some embodiments an electrical connector is provided. The electrical connector includes a plurality of signal conductors, wherein the signal conductors are configured to produce an electric field pattern when carrying a low voltage differential signal at a frequency of 40 GHz, the field pattern defining regions of higher and lower electric field strength, and insulative material holding the plurality of signal conductors, wherein the insulative material comprises a plurality of openings along at least a portion of a length of signal conductors of the plurality of signal conductors, wherein the openings are selectively positioned with respect to regions of the higher electric field strength. In some embodiments, the dielectric loss exhibited by a 14 GHz 50 millivolt differential signal is at least 10% less in comparison to an insulative housing without openings. In some embodiments, the loss exhibited by the 14 GHz differential signal is at least 15% less in comparison to an insulative housing without openings. In some embodiments, the loss exhibited by the 14

GHz low voltage differential signal is at least 0.5 dB less in comparison to an insulative housing without openings.

In some embodiments, at least one surface of each of the signal conductors of the plurality of signal conductors is exposed within the plurality of openings. In some embodiments, the signal conductors are supported by pedestal portions of the insulative housing, with one or more pedestal portions having respective widths that are narrower than the widths of the respective surfaces of the signal conductors.

In some embodiments, the signals conductors are arranged in a plurality of rows, with first ends positioned to form a first interface and second ends positioned to form a second interface, and the first interface is at an angle with respect to the second interface such that each row of the plurality of rows is a different length. The dimensions of the openings within a set of the signal conductors of a row may be determined based on the lengths of the set of the signal conductors of the row.

In some embodiments, a method for manufacturing a module for an electrical connector is provided. The method may include positioning a central member of an insulative support between at least two conductors. Each of the at least two conductors including: an intermediate portion connecting a first end and a second end, the intermediate portion comprising two edges and two sides between the edges, the sides being wider than the edges. The central member may include a first pedestal portion and a second pedestal portion that contact respective portions of a first and second conductor. The method may include positioning a first cover and a second cover of the insulative support adjacent to the first conductor and the second conductor respectively, each of the first and second cover comprising a respective pedestal portion that contact respective sides of the conductors not in contact with the central member, wherein a portion of at least one surface of each conductor is exposed within an opening between the central member and one of the covers. The method may further include surrounding at least a portion of the covers and the central member with one or more reference conductors. In some embodiments, the pedestal portions of the insulative support define one or more openings in a dielectric material, and the method may further include positioning one or more edges of the conductors in the one or more openings. In some embodiments, the method further includes forming wafers by, at least in part, positioning a plurality of lossy members so that each lossy member is electrically coupled to a plurality of reference conductors, and aligning the plurality of wafers. In some embodiments, the wafers are aligned in parallel.

Techniques for reducing dielectric loss as described herein may be applied in connectors with broadside coupled pairs over all or a portion of their length. Such techniques may be applied in right angle or other connectors including broadside-coupled differential pairs. Such techniques may also be applied in vertical or other connectors with edge-coupled differential pairs.

FIG. 1 illustrates an electrical interconnection system of the form that may be used in an electronic system. In this example, the electrical interconnection system includes a right angle connector and may be used, for example, in electrically connecting a daughtercard to a backplane. These figures illustrate two mating connectors. In this example, connector 200 is designed to be attached to a backplane and connector 600 is designed to attach to a daughtercard. As can be seen in FIG. 1, daughtercard connector 600 includes contact tails 610 designed to attach to a daughtercard (not shown). Backplane connector 200 includes contact tails 210, designed to attach to a backplane (not shown). These contact tails form one end of conductive elements that pass through the interconnection system. When the connectors are mounted to printed circuit boards, these contact tails will make electrical connection to conductive structures within the printed circuit board that carry signals or are connected to a reference potential. In the example illustrated the contact tails are press fit, "eye of the needle," contacts that are designed to be pressed into vias in a printed circuit board. However, other forms of contact tails may be used.

Each of the connectors also has a mating interface where that connector can mate—or be separated from—the other connector. Daughtercard connector 600 includes a mating interface 620. Backplane connector 200 includes a mating interface 220. Though not fully visible in the view shown in FIG. 1, mating contact portions of the conductive elements are exposed at the mating interface.

Each of these conductive elements includes an intermediate portion that connects a contact tail to a mating contact portion. The intermediate portions may be held within a connector housing, at least a portion of which may be dielectric so as to provide electrical isolation between conductive elements. Additionally, the connector housings may include conductive or lossy portions, which in some embodiments may provide conductive or partially conductive paths between some of the conductive elements. In some embodiments, the conductive portions may provide shielding. The lossy portions may also provide shielding in some instances and/or may provide desirable electrical properties within the connectors.

In various embodiments, dielectric members may be molded or over-molded from a dielectric material such as plastic or nylon. Examples of suitable materials include, but are not limited to, liquid crystal polymer (LCP), polyphenyline sulfide (PPS), high temperature nylon or polyphenylenoxide (PPO) or polypropylene (PP). Other suitable materials may be employed, as aspects of the present disclosure are not limited in this regard.

All of the above-described materials are suitable for use as binder material in manufacturing connectors. In accordance some embodiments, one or more fillers may be included in some or all of the binder material. As a non-limiting example, thermoplastic PPS filled to 30% by volume with glass fiber may be used to form the entire connector housing or dielectric portions of the housings.

Alternatively or additionally, portions of the housings may be formed of conductive materials, such as machined metal or pressed metal powder. In some embodiments, portions of the housing may be formed of metal or other conductive material with dielectric members spacing signal conductors from the conductive portions. In the embodiment illustrated, for example, a housing of backplane connector 200 may have regions formed of a conductive material with insulative members separating the intermediate portions of signal conductors from the conductive portions of the housing.

The housing of daughtercard connector 600 may also be formed in any suitable way. In the embodiment illustrated, daughtercard connector 600 may be formed from multiple subassemblies, referred to herein as "wafers." Each of the wafers (700, FIG. 7) may include a housing portion, which may similarly include dielectric, lossy and/or conductive portions. One or more members may hold the wafers in a desired position. For example, support members 612 and 614 may hold top and rear portions, respectively, of multiple wafers in a side-by-side configuration. Support members 612 and 614 may be formed of any suitable material, such as a sheet of metal stamped with tabs, openings or other features that engage corresponding features on the individual wafers.

Other members that may form a portion of the connector housing may provide mechanical integrity for daughtercard connector 600 and/or hold the wafers in a desired position. For example, a front housing portion 640 (FIG. 6) may receive portions of the wafers forming the mating interface. Any or all of these portions of the connector housing may be dielectric, lossy and/or conductive, to achieve desired electrical properties for the interconnection system.

In some embodiments, each wafer may hold a column of conductive elements forming signal conductors. These signal conductors may be shaped and spaced to form single ended signal conductors. However, in the embodiment illustrated in FIG. 1, the signal conductors are shaped and spaced in pairs to provide differential signal conductors. Each of the columns may include or be bounded by conductive elements serving as ground conductors. It should be appreciated that ground conductors need not be connected to earth ground, but are shaped to carry reference potentials, which may include earth ground, DC voltages or other suitable reference potentials. The "ground" or "reference" conductors may have a shape different than the signal conductors, which are configured to provide suitable signal transmission properties for high frequency signals.

Conductive elements may be made of metal or any other material that is conductive and provides suitable mechanical properties for conductive elements in an electrical connector. Phosphor-bronze, beryllium copper and other copper alloys are non-limiting examples of materials that may be used. The conductive elements may be formed from such materials in any suitable way, including by stamping and/or forming.

The spacing between adjacent columns of conductors may be within a range that provides a desirable density and desirable signal integrity. As a non-limiting example, the conductors may be stamped from 0.4 mm thick copper alloy, and the conductors within each column may be spaced apart by 2.25 mm and the columns of conductors may be spaced apart by 2.4 mm. However, a higher density may be achieved by placing the conductors closer together. In other embodiments, for example, smaller dimensions may be used to provide higher density, such as a thickness between 0.2 and 0.4 mm or spacing of 0.7 to 1.85 mm between columns or between conductors within a column. Moreover, each column may include four pairs of signal conductors, such that a density of 60 or more pairs per linear inch is achieved for the interconnection system illustrated in FIG. 1. However, it should be appreciated that more pairs per column, tighter spacing between pairs within the column and/or smaller distances between columns may be used to achieve a higher density connector.

The wafers may be formed any suitable way. In some embodiments, the wafers may be formed by stamping columns of conductive elements from a sheet of metal and over molding dielectric portions on the intermediate portions of the conductive elements. In other embodiments, wafers may be assembled from modules each of which includes a single, single-ended signal conductor, a single pair of differential signal conductors or any suitable number of single ended or differential pairs.

Assembling wafers from modules may aid in reducing "skew" in signal pairs at higher frequencies, such as between about 25 GHz and 40 GHz, or higher. Skew, in this context, refers to the difference in electrical propagation time between signals of a pair that operates as a differential signal. Modular construction that reduces skew is designed described, for example in application 61/930,411, which is incorporated herein by reference.

In accordance with techniques described in that application, in some embodiments, connectors may be formed of modules, each carrying a signal pair. The modules may be individually shielded, such as by attaching shield members to the modules and/or inserting the modules into an organizer or other structure that may provide electrical shielding between pairs and/or ground structures around the conductive elements carrying signals.

In some embodiments, signal conductor pairs within each module may be broadside coupled over substantial portions of their lengths. Broadside coupling enables the signal conductors in a pair to have the same physical length. To facilitate routing of signal traces within the connector footprint of a printed circuit board to which a connector is attached and/or constructing of mating interfaces of the connectors, the signal conductors may be aligned with edge to edge coupling in one or both of these regions. As a result, the signal conductors may include transition regions in which coupling changes from edge-to-edge to broadside or vice versa. As described below, these transition regions may be designed to prevent mode conversion or suppress undesired propagation modes that can interfere with signal integrity of the interconnection system.

The modules may be assembled into wafers or other connector structures. In some embodiments, a different module may be formed for each row position at which a pair is to be assembled into a right angle connector. These modules may be made to be used together to build up a connector with as many rows as desired. For example, a module of one shape may be formed for a pair to be positioned at the shortest rows of the connector, sometimes called the a-b rows. A separate module may be formed for conductive elements in the next longest rows, sometimes called the c-d rows. The inner portion of the module with the c-d rows may be designed to conform to the outer portion of the module with the a-b rows.

Figure 8:
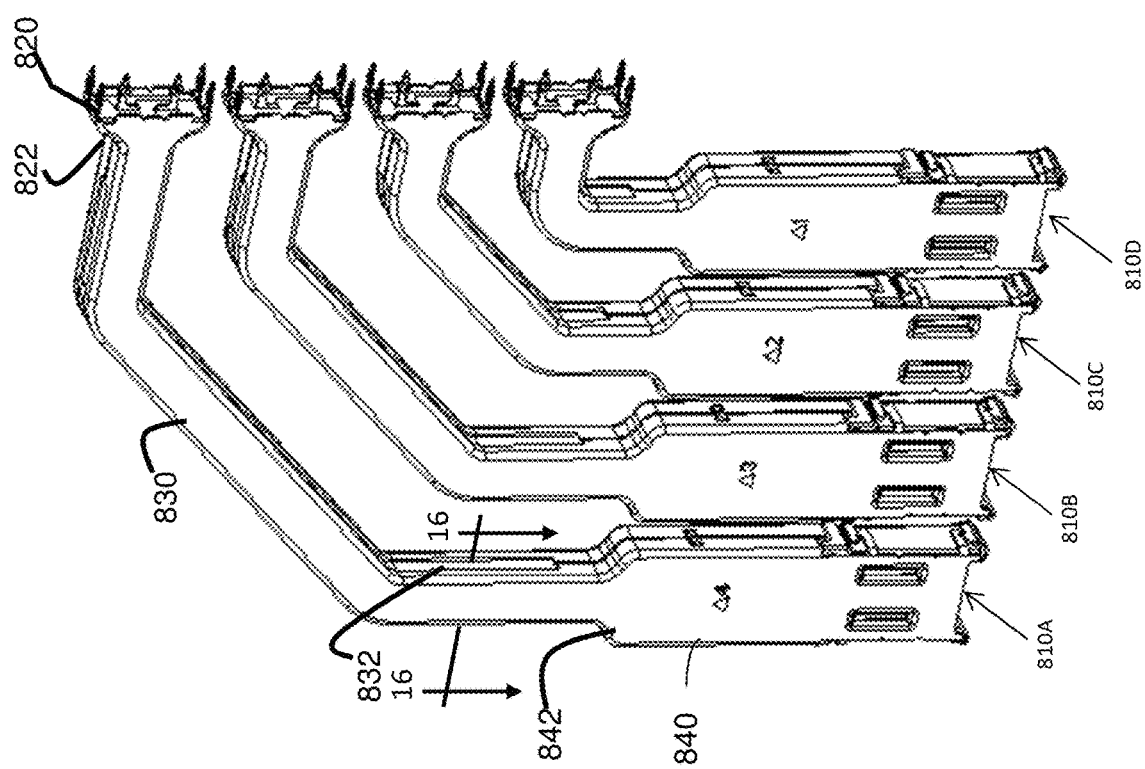
FIG. 8 is an isometric view of wafer modules of the wafer assembly of FIG. 7.

This pattern may be repeated for any number of pairs. Each module may be shaped to be used with modules that carry pairs for shorter and/or longer rows. To make a connector of any suitable size, a connector manufacturer may assemble into a wafer a number of modules to provide a desired number of pairs in the wafer. In this way, a connector manufacturer may introduce a connector family for a widely used connector size—such as 2 pairs. As customer requirements change, the connector manufacturer may procure tools for each additional pair, or, for modules that contain multiple pairs, group of pairs to produce connectors of larger sizes. The tooling used to produce modules for smaller connectors can be used to produce modules for the shorter rows even of the larger connectors. Such a modular connector is illustrated in FIG. 8.

Figure 2:
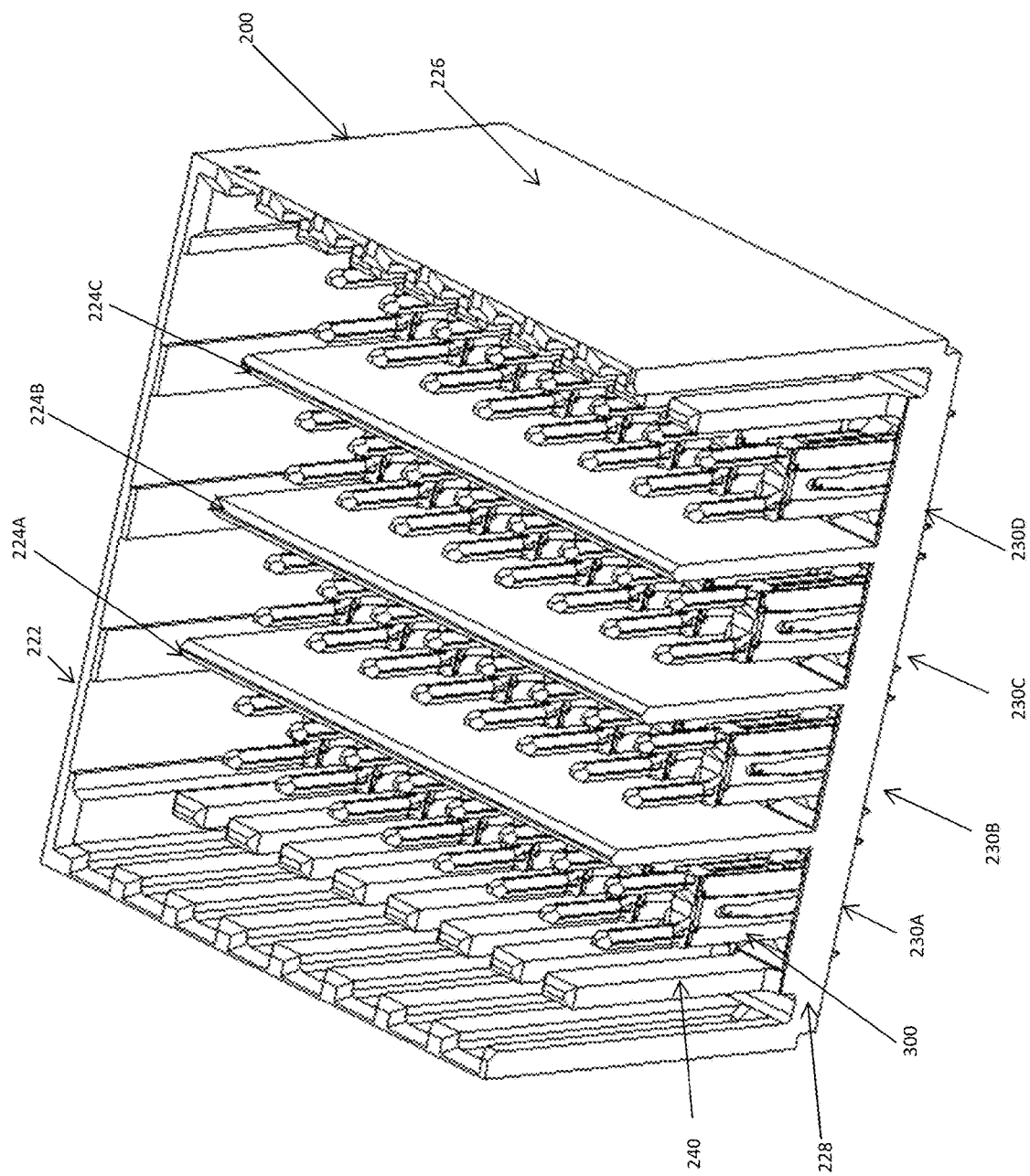
FIG. 2 is an isometric view, partially cutaway, of the backplane connector of FIG. 1.

Further details of the construction of the interconnection system of FIG. 1 are provided in FIG. 2, which shows backplane connector 200 partially cutaway. In the embodiment illustrated in FIG. 2, a forward wall of housing 222 is cut away to reveal the interior portions of mating interface 220.

In the embodiment illustrated, backplane connector 200 also has a modular construction. Multiple pin modules 300 are organized to form an array of conductive elements. Each of the pin modules 300 may be designed to mate with a module of daughtercard connector 600.

In the embodiment illustrated, four rows and eight columns of pin modules 300 are shown. With each pin module having two signal conductors, the four rows 230A, 230B, 230C and 230D of pin modules create columns with four pairs or eight signal conductors, in total. It should be appreciated, however, that the number of signal conductors per row or column is not a limitation of the invention. A greater or lesser number of rows of pin modules may be included within housing 222. Likewise, a greater or lesser number of columns may be included within housing 222. Alternatively or additionally, housing 222 may be regarded as a module of a backplane connector, and multiple such modules may be aligned side to side to extend the length of a backplane connector.

In the embodiment illustrated in FIG. 2, each of the pin modules 300 contains conductive elements serving as signal conductors. Those signal conductors are held within insulative members, which may serve as a portion of the housing of backplane connector 200. The insulative portions of the pin modules 300 may be positioned to separate the signal conductors from other portions of housing 222. In this configuration, other portions of housing 222 may be conductive or partially conductive, such as may result from the use of lossy materials.

In some embodiments, housing 222 may contain both conductive and lossy portions. For example, a shroud including walls 226 and a floor 228 may be pressed from a powdered metal or formed from conductive material in any other suitable way. Pin modules 300 may be inserted into openings within floor 228.

Lossy or conductive members may be positioned adjacent rows 230A, 230B, 230C and 230D of pin modules 300. In the embodiment of FIG. 2, separators 224A, 224B and 224C are shown between adjacent rows of pin modules. Separators 224A, 224B and 224C may be conductive or lossy, and may be formed as part of the same operation or from the same member that forms walls 226 and floor 228. Alternatively, separators 224A, 224B and 224C may be inserted separately into housing 222 after walls 226 and floor 228 are formed. In embodiments in which separators 224A, 224B and 224C formed separately from walls 226 and floor 228 and subsequently inserted into housing 222, separators 224A, 224B and 224C may be formed of a different material than walls 226 and/or floor 228. For example, in some embodiments, walls 226 and floor 228 may be conductive while separators 224A, 224B and 224C may be lossy or partially lossy and partially conductive.

In some embodiments, other lossy or conductive members may extend into mating interface 220, perpendicular to floor 228. Members 240 are shown adjacent to end-most rows 230A and 230D. In contrast to separators 224A, 224B and 224C, which extend across the mating interface 220, separator members 240, approximately the same width as one column, are positioned in rows adjacent row 230A and row 230D. Daughtercard connector 600 may include, in its mating interface 620, slots to receive, separators 224A, 224B and 224C. Daughtercard connector 600 may include openings that similarly receive members 240. Members 240 may have a similar electrical effect to separators 224A, 224B and 224C, in that both may suppress resonances, crosstalk or other undesired electrical effects. Members 240, because they fit into smaller openings within daughtercard connector 600 than separators 224A, 224B and 224C, may enable greater mechanical integrity of housing portions of daughtercard connector 600 at the sides where members 240 are received.

Figure 3:
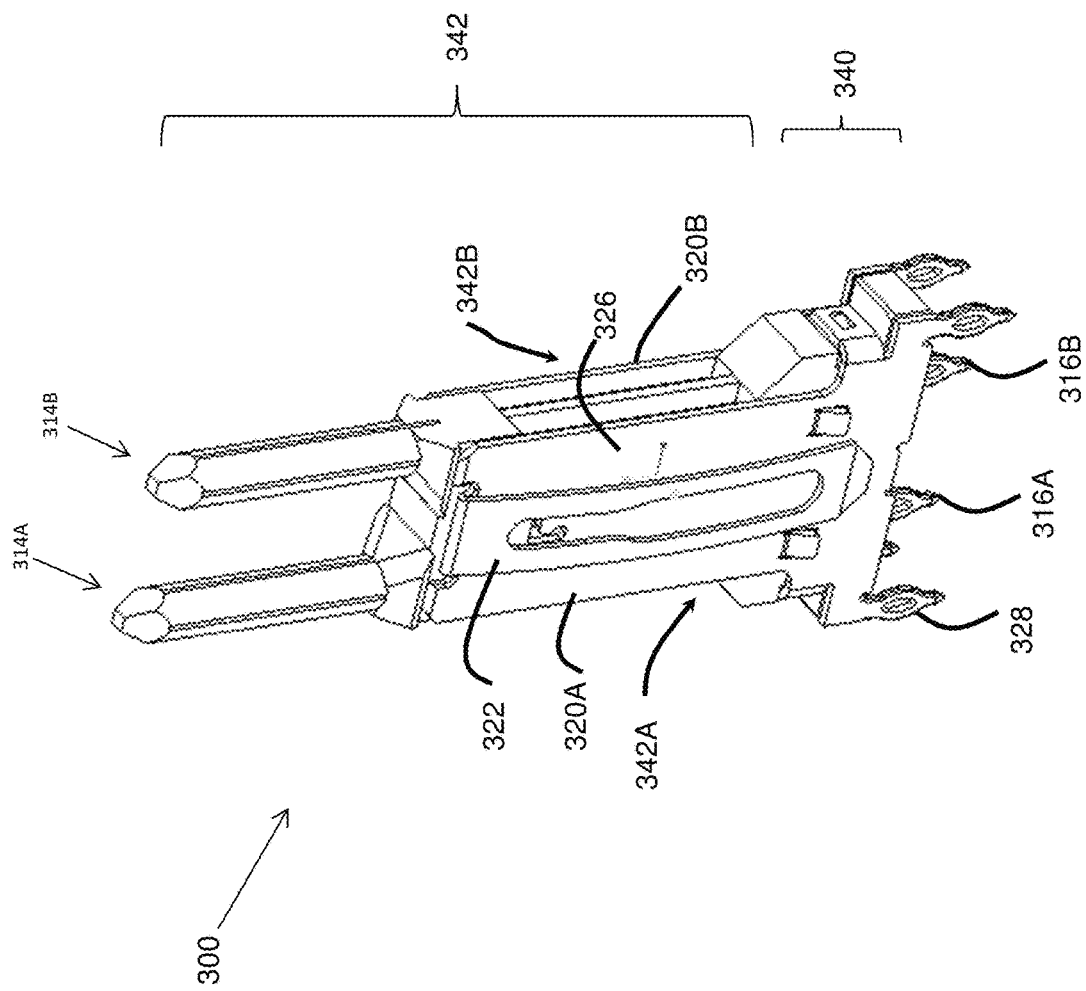
FIG. 3 is an isometric view of a pin assembly of the backplane connector of FIG. 2.

FIG. 3 illustrates a pin module 300 in greater detail. In this embodiment, each pin module includes a pair of conductive elements acting as signal conductors 314A and 314B. Each of the signal conductors has a mating interface portion shaped as a pin. Opposing ends of the signal conductors have contact tails 316A and 316B. In this embodiment, the contact tails are shaped as press fit compliant sections. Intermediate portions of the signal conductors, connecting the contact tails to the mating contact portions, pass through pin module 300.

Conductive elements serving as reference conductors 320A and 320B are attached at opposing exterior surfaces of pin module 300. Each of the reference conductors has contact tails 328, shaped for making electrical connections to vias within a printed circuit board. The reference conductors also have mating contact portions. In the embodiment illustrated, two types of mating contact portions are illustrated. Compliant member 322 may serve as a mating contact portion, pressing against a reference conductor in daughtercard connector 600. In some embodiments, surfaces 324 and 326 alternatively or additionally may serve as mating contact portions, where reference conductors from the mating conductor may press against reference conductors 320A or 320B. However, in the embodiment illustrated, the reference conductors may be shaped such that electrical contact is made only at compliant member 322.

Figure 4:
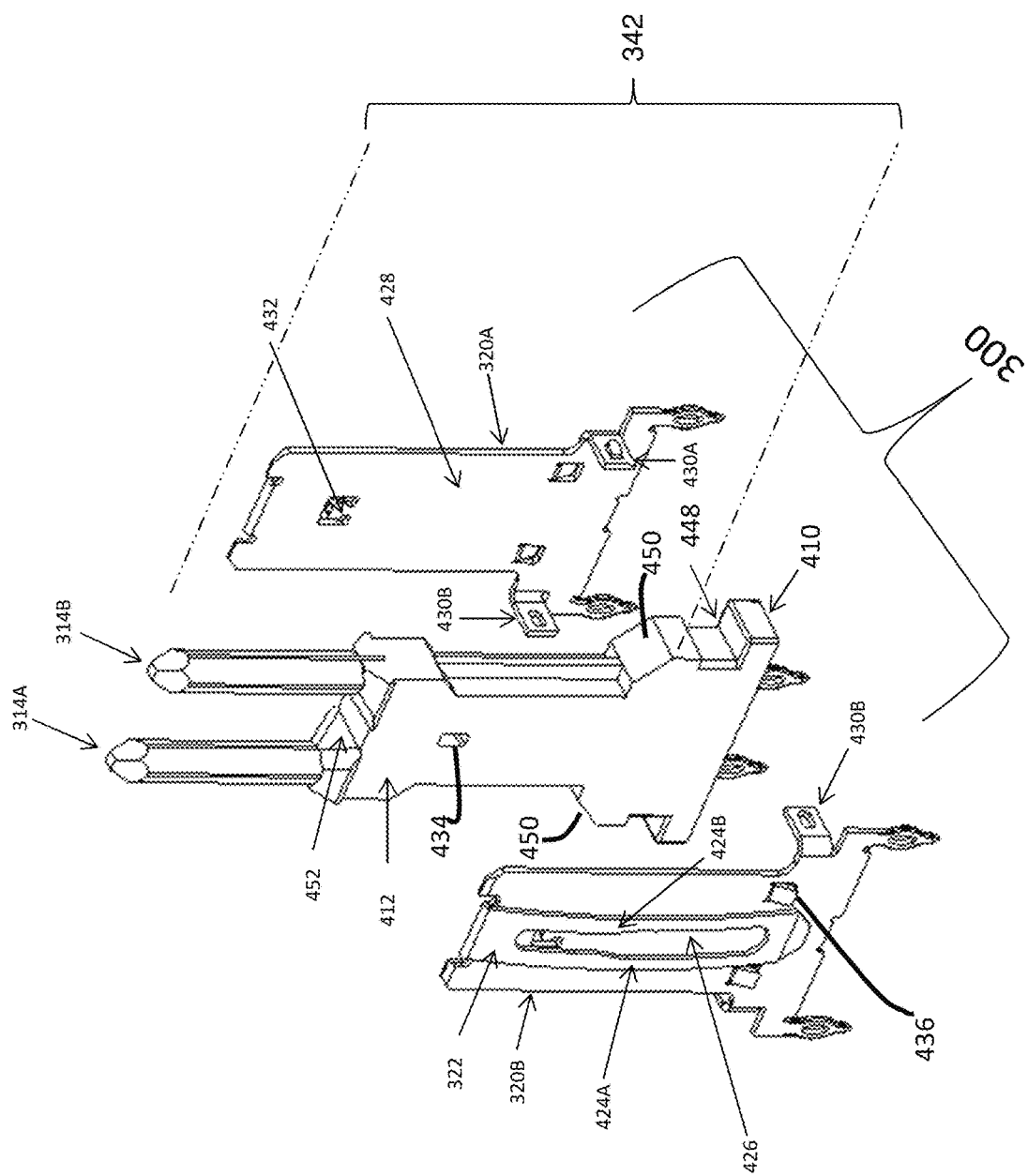
FIG. 4 is an exploded view of the pin assembly of FIG. 3.

FIG. 4 shows an exploded view of pin module 300. Intermediate portions of the signal conductors 314A and 314B are held within an insulative member 410, which may form a portion of the housing of backplane connector 200. Insulative member 410 may be insert molded around signal conductors 314A and 314B. A surface 412 against which reference conductor 320B presses is visible in the exploded view of FIG. 4. Likewise, the surface 428 of reference conductor 320A, which presses against a surface of member 410 not visible in FIG. 4, can also be seen in this view.

As can be seen, the surface 428 is substantially unbroken. Attachment features, such as tab 432 may be formed in the surface 428. Such a tab may engage an opening (not visible in the view shown in FIG. 4) in insulative member 410 to hold reference conductor 320A to insulative member 410. A similar tab (not numbered) may be formed in reference conductor 320B. As shown, these tabs, which serve as attachment mechanisms, are centered between signal conductors 314A and 314B where radiation from or affecting the pair is relatively low. Additionally, tabs, such as 436, may be formed in reference conductors 320A and 320B. Tabs 436 may engage insulative member 410 to hold pin module 300 in an opening in floor 228.

In the embodiment illustrated, compliant member 322 is not cut from the planar portion of the reference conductor 320B that presses against the surface 412 of the insulative member 410. Rather, compliant member 322 is formed from a different portion of a sheet of metal and folded over to be parallel with the planar portion of the reference conductor 320B. In this way, no opening is left in the planar portion of the reference conductor 320B from forming compliant member 322. Moreover, as shown, compliant member 322 has two compliant portions 424A and 424B, which are joined together at their distal ends but separated by an opening 426. This configuration may provide mating contact portions with a suitable mating force in desired locations without leaving an opening in the shielding around pin module 300. However, a similar effect may be achieved in some embodiments by attaching separate compliant members to reference conductors 320A and 320B.

The reference conductors 320A and 320B may be held to pin module 300 in any suitable way. As noted above, tabs 432 may engage an opening 434 in the housing portion. Additionally or alternatively, straps or other features may be used to hold other portions of the reference conductors. As shown each reference conductor includes straps 430A and 430B. Straps 430A include tabs while straps 430B include openings adapted to receive those tabs. Here reference conductors 320A and 320B have the same shape, and may be made with the same tooling, but are mounted on opposite surfaces of the pin module 300. As a result, a tab 430A of one reference conductor aligns with a tab 430B of the opposing reference conductor such that the tab 430A and the tab 430B interlock and hold the reference conductors in place. These tabs may engage in an opening 448 in the insulative member, which may further aid in holding the reference conductors in a desired orientation relative to signal conductors 314A and 314B in pin module 300.

FIG. 4 further reveals a tapered surface 450 of the insulative member 410. In this embodiment surface 450 is tapered with respect to the axis of the signal conductor pair formed by signal conductors 314A and 314B. Surface 450 is tapered in the sense that it is closer to the axis of the signal conductor pair closer to the distal ends of the mating contact portions and further from the axis further from the distal ends. In the embodiment illustrated, pin module 300 is symmetrical with respect to the axis of the signal conductor pair and a tapered surface 450 is formed adjacent each of the signal conductors 314A and 314B.

In accordance with some embodiments, some or all of the adjacent surfaces in mating connectors may be tapered. Accordingly, though not shown in FIG. 4, surfaces of the insulative portions of daughtercard connector 600 that are adjacent to tapered surfaces 450 may be tapered in a complementary fashion such that the surfaces from the mating connectors conform to one another when the connectors are in the designed mating positions.

Tapered surfaces in the mating interfaces may avoid abrupt changes in impedance as a function of connector separation. Accordingly, other surfaces designed to be adjacent a mating connector may be similarly tapered. FIG. 4 shows such tapered surfaces 452. As shown, tapered surfaces 452 are between signal conductors 314A and 314B. Surfaces 450 and 452 cooperate to provide a taper on the insulative portions on both sides of the signal conductors.

Figure 5:
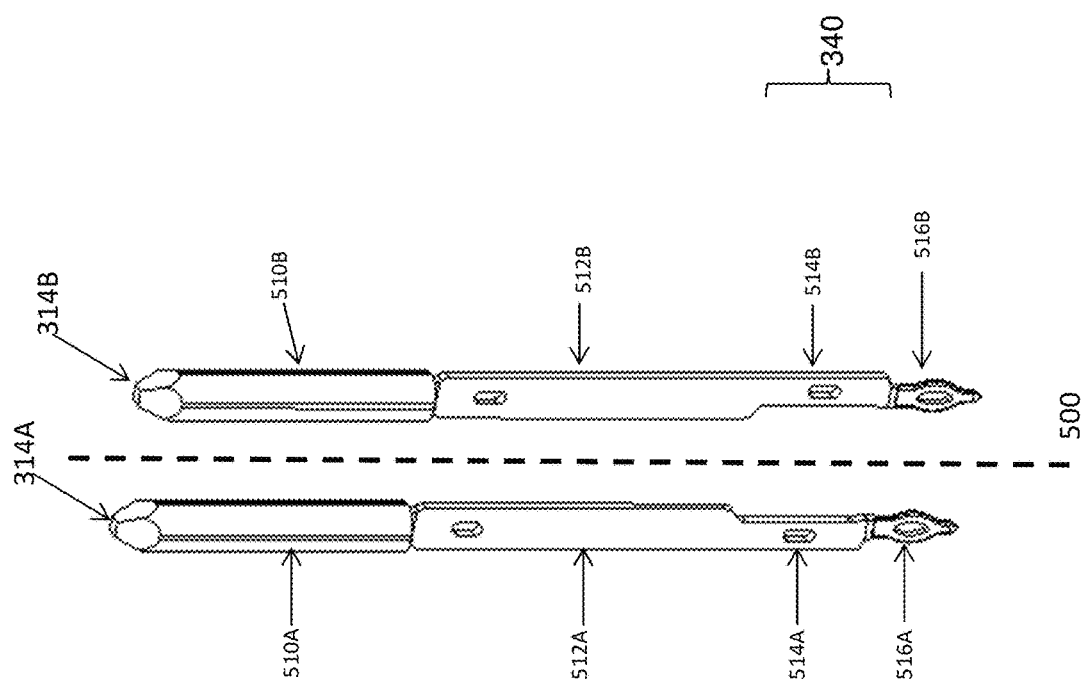
FIG. 5 is an isometric view of signal conductors of the pin assembly of FIG. 3.

FIG. 5 shows further detail of pin module 300. Here, the signal conductors are shown separated from the pin module. FIG. 5 illustrates the signal conductors before being over molded by insulative portions or otherwise being incorporated into a pin module 300. However, in some embodiments, the signal conductors may be held together by a carrier strip or other suitable support mechanism, not shown in FIG. 5, before being assembled into a module.

In the illustrated embodiment, the signal conductors 314A and 314B are symmetrical with respect to an axis 500 of the signal conductor pair. Each has a mating contact portion, 510A or 510B shaped as a pin. Each also has an intermediate portion 512A or 512B, and 514A or 514B. Here, different widths are provided to provide for matching impedance to a mating connector and a printed circuit board, despite different materials or construction techniques in each. A transition region may be included, as illustrated, to provide a gradual transition between regions of different width. Contact tails 516A or 516B may also be included.

In the embodiment illustrated, intermediate portions 512A, 512B, 514A and 514B may be flat, with broadsides and narrower edges. The signal conductors of the pairs are, in the embodiment illustrated, aligned edge-to-edge and are thus configured for edge coupling. In other embodiments, some or all of the signal conductor pairs may alternatively be broadside coupled.

Mating contact portions may be of any suitable shape, but in the embodiment illustrated, they are cylindrical. The cylindrical portions may be formed by rolling portions of a sheet of metal into a tube or in any other suitable way. Such a shape may be created, for example, by stamping a shape from a sheet of metal that includes the intermediate portions. A portion of that material may be rolled into a tube to provide the mating contact portion. Alternatively or additionally, a wire or other cylindrical element may be flattened to form the intermediate portions, leaving the mating contact portions cylindrical. One or more openings (not numbered) may be formed in the signal conductors. Such openings may ensure that the signal conductors are securely engaged with the insulative member 410.

Figure 6:
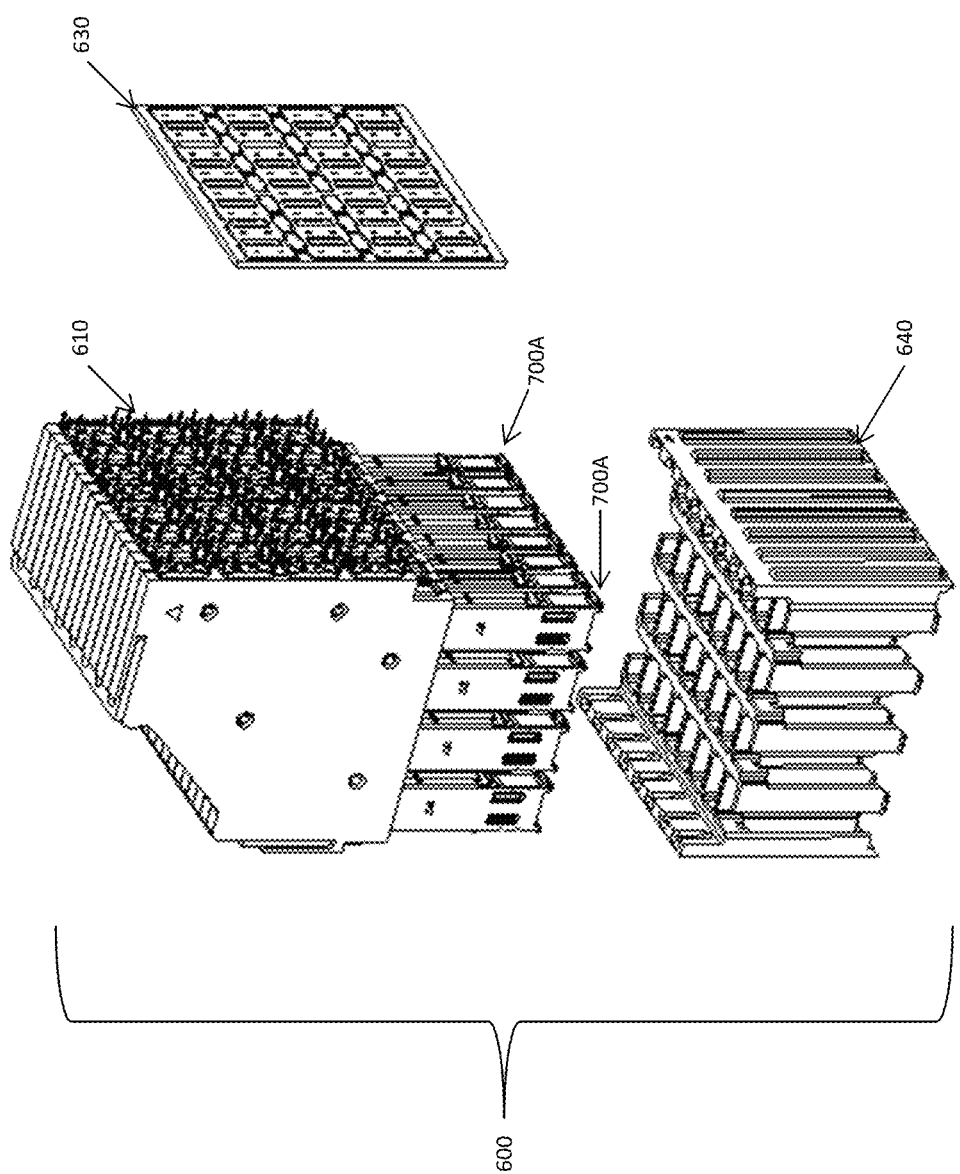
FIG. 6 is an isometric view, partially exploded, of the daughtercard connector of FIG. 1.

Turning to FIG. 6, further details of daughtercard connector 600 are shown in a partially exploded view. As shown, connector 600 includes multiple wafers 700A held together in a side-by-side configuration. Here, eight wafers, corresponding to the eight columns of pin modules in backplane connector 200, are shown. However, as with backplane connector 200, the size of the connector assembly may be configured by incorporating more rows per wafer, more wafers per connector or more connectors per interconnection system.

Conductive elements within the wafers 700A may include mating contact portions and contact tails. Contact tails 610 are shown extending from a surface of connector 600 adapted for mounting against a printed circuit board. In some embodiments, contact tails 610 may pass through a member 630. Member 630 may include insulative, lossy and/or conductive portions. In some embodiments, contact tails associated with signal conductors may pass through insulative portions of member 630. Contact tails associated with reference conductors may pass through lossy or conductive portions of member 630. In some embodiments, the lossy or conductive portions may be compliant, enabling those portions to conform to and press against ground conductors within the connector and ground pads on a printed circuit board to which the connector is mounted, improving the shielding capabilities of member 630 at the mounting interface of the connector.

Mating contact portions of the wafers 700A are held in a front housing portion 640. The front housing portion may be made of any suitable material, which may be insulative, lossy or conductive or may include any suitable combination or such materials. For example the front housing portion may be molded from a filled, lossy material or may be formed from a conductive material, using materials and techniques similar to those described above for the housing walls 226. As shown, the wafers are assembled from modules 810A, 810B, 810C and 810D (FIG. 8), each with a pair of signal conductors surrounded by reference conductors. In the embodiment illustrated, front housing portion 640 has multiple passages, each positioned to receive one such pair of signal conductors and associated reference conductors. However, it should be appreciated that each module might contain a single signal conductor or more than two signal conductors.

Figure 7:
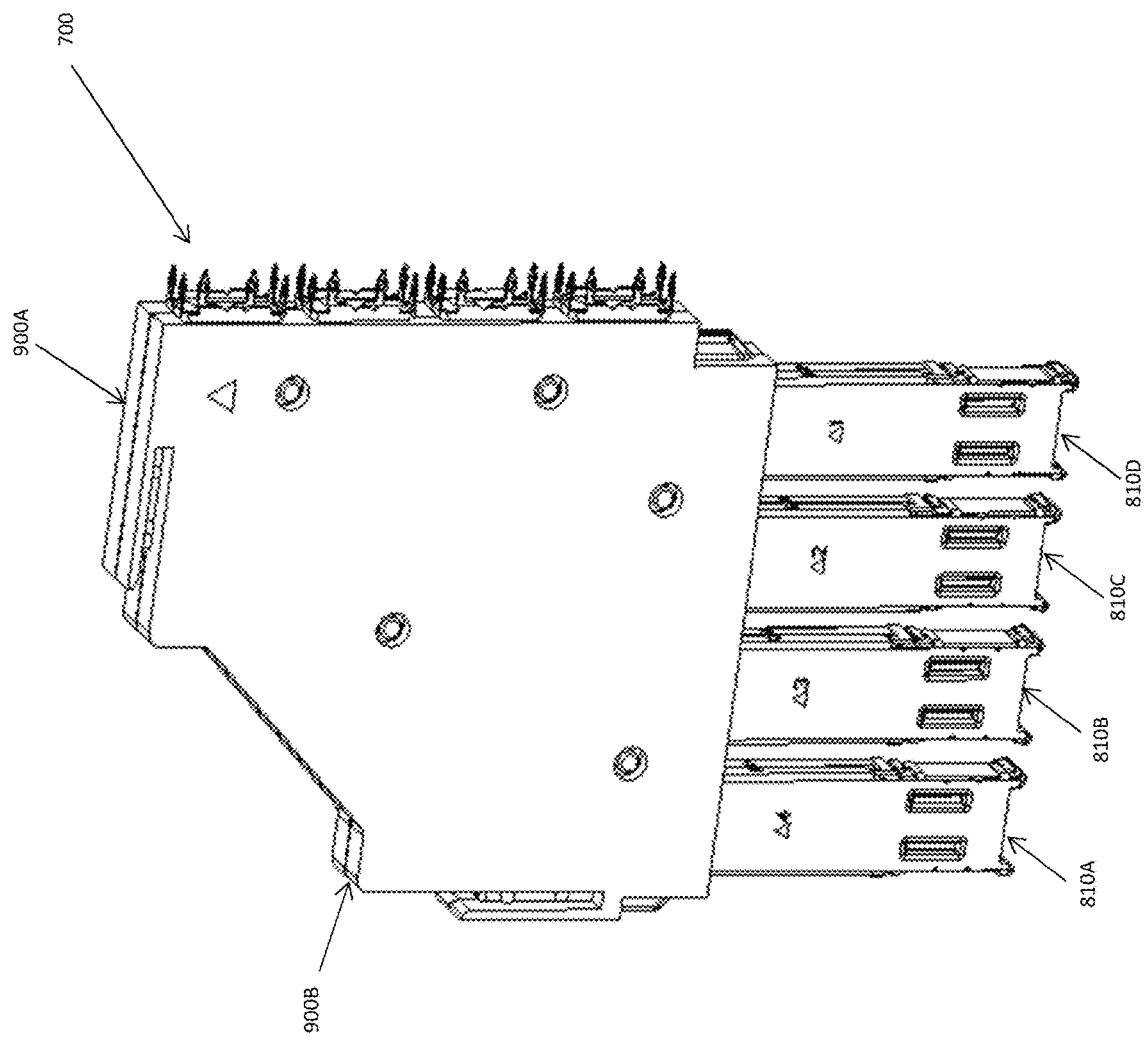
FIG. 7 is an isometric view of a wafer assembly of the daughtercard connector of FIG. 6.

FIG. 7 illustrates a wafer 700. Multiple such wafers may be aligned side-by-side and held together with one or more support members, or in any other suitable way, to form a daughtercard connector. In the embodiment illustrated, wafer 700 is formed from multiple modules 810A, 810B, 810C and 810D. The modules are aligned to form a column of mating contact portions along one edge of wafer 700 and a column of contact tails along another edge of wafer 700.

In the embodiment in which the wafer is designed for use in a right angle connector, as illustrated, those edges are perpendicular.

In the embodiment illustrated, each of the modules includes reference conductors that at least partially enclose the signal conductors. The reference conductors may similarly have mating contact portions and contact tails.

The modules may be held together in any suitable way. For example, the modules may be held within a housing, which in the embodiment illustrated is formed with members 900A and 900B. Members 900A and 900B may be formed separately and then secured together, capturing modules 810A . . . 810D between them. Members 900A and 900B may be held together in any suitable way, such as by attachment members that form an interference fit or a snap fit. Alternatively or additionally, adhesive, welding or other attachment techniques may be used.

Members 900A and 900B may be formed of any suitable material. That material may be an insulative material. Alternatively or additionally, that material may be or may include portions that are lossy or conductive. Members 900A and 900B may be formed, for example, by molding such materials into a desired shape. Alternatively, members 900A and 900B may be formed in place around modules 810A . . . 810D, such as via an insert molding operation. In such an embodiment, it is not necessary that members 900A and 900B be formed separately. Rather, a housing portion to hold modules 810A . . . 810D may be formed in one operation.

FIG. 8 shows modules 810A . . . 810D without members 900A and 900B. In this view, the reference conductors are visible. Signal conductors (not visible in FIG. 8) are enclosed within the reference conductors, forming a waveguide structure. Each waveguide structure includes a contact tail region 820, an intermediate region 830 and a mating contact region 840. Within the mating contact region 840 and the contact tail region 820, the signal conductors are positioned edge to edge. Within the intermediate region 830, the signal conductors are positioned for broadside coupling. Transition regions 822 and 842 are provided to transition between the edge coupled orientation and the broadside coupled orientation.

The transition regions 822 and 842 in the reference conductors may correspond to transition regions in signal conductors, as described below. In the illustrated embodiment, reference conductors form an enclosure around the signal conductors. A transition region in the reference conductors, in some embodiments, may keep the spacing between the signal conductors and reference conductors generally uniform over the length of the signal conductors. Thus, the enclosure formed by the reference conductors may have different widths in different regions.

The reference conductors provide shielding coverage along the length of the signal conductors. As shown, coverage is provided over substantially all of the length of the signal conductors, with coverage in the mating contact portion and the intermediate portions of the signal conductors. The contact tails are shown exposed so that they can make contact with the printed circuit board. However, in use, these mating contact portions will be adjacent ground structures within a printed circuit board such that being exposed as shown in FIG. 8 does not detract from shielding coverage along substantially all of the length of the signal conductor. In some embodiments, mating contact portions might also be exposed for mating to another connector. Accordingly, in some embodiments, shielding coverage may be provided over more than 80%, 85%, 90% or 95% of the intermediate portion of the signal conductors. Similarly shielding coverage may also be provided in the transition regions, such that shielding coverage may be provided over more than 80%, 85%, 90% or 95% of the combined length of the intermediate portion and transition regions of the signal conductors. In some embodiments, as illustrated, the mating contact regions and some or all of the contact tails may also be shielded, such that shielding coverage may be, in various embodiments, over more than 80%, 85%, 90% or 95% of the length of the signal conductors.

In the embodiment illustrated, a waveguide-like structure formed by the reference conductors has a wider dimension in the column direction of the connector in the contact tail regions 820 and the mating contact region 840 to accommodate for the wider dimension of the signal conductors being side-by-side in the column direction in these regions. In the embodiment illustrated, contact tail regions 820 and the mating contact region 840 of the signal conductors are separated by a distance that aligns them with the mating contacts of a mating connector or contact structures on a printed circuit board to which the connector is to be attached.

These spacing requirements mean that the waveguide will be wider in the column dimension than it is in the transverse direction, providing an aspect ratio of the waveguide in these regions that may be at least 2:1, and in some embodiments may be on the order of at least 3:1. Conversely, in the intermediate region 830, the signal conductors are oriented with the wide dimension of the signal conductors overlaid in the column dimension, leading to an aspect ratio of the waveguide that may be less than 2:1, and in some embodiments may be less than 1.5:1 or on the order of 1:1.

With this smaller aspect ratio, the largest dimension of the waveguide in the intermediate region 830 will be smaller than the largest dimension of the waveguide in regions 830 and 840. Because the lowest frequency propagated by a waveguide is inversely proportional to the length of its shortest dimension, the lowest frequency mode of propagation that can be excited in intermediate region 830 is higher than can be excited in contact tail regions 820 and the mating contact region 840. The lowest frequency mode that can be excited in the transition regions will be intermediate between the two. Because the transition from edge coupled to broadside coupling has the potential to excite undesired modes in the waveguides, signal integrity may be improved if these modes are at higher frequencies than the intended operating range of the connector, or at least are as high as possible.

These regions may be configured to avoid mode conversion upon transition between coupling orientations, which would excite propagation of undesired signals through the waveguides. For example, as shown below, the signal conductors may be shaped such that the transition occurs in the intermediate region 830 or the transition regions 822 and 842, or partially within both. Additionally or alternatively, the modules may be structured to suppress undesired modes excited in the waveguide formed by the reference conductors, as described in greater detail below.

Though the reference conductors may substantially enclose each pair, it is not a requirement that the enclosure be without openings. Accordingly, in embodiments shaped to provide rectangular shielding, the reference conductors in the intermediate regions may be aligned with at least portions of all four sides of the signal conductors. The reference conductors may combine for example to provide 360 degree coverage around the pair of signal conductors. Such coverage may be provided, for example, by overlapping or physically contact reference conductors. In the illustrated embodiment, the reference conductors are U-shaped shells and come together to form an enclosure.

Three hundred sixty degree coverage may be provided regardless of the shape of the reference conductors. For example, such coverage may be provided with circular or elliptical reference conductors or reference conductors of any other suitable shape. However, it is not a requirement that the coverage be complete. The coverage, for example, may have an angular extent in the range between about 270 and 365 degrees. In some embodiments, the coverage may be in the range of about 340 to 360 degrees. Such coverage may be achieved for example, by slots or other openings in the reference conductors.

In some embodiments, the shielding coverage may be different in different regions. In the transition regions, the shielding coverage may be greater than in the intermediate regions. In some embodiments, the shielding coverage may have an angular extent of greater than 355 degrees, or even in some embodiments 360 degrees, resulting from direct contact, or even overlap, in reference conductors in the transition regions even if less shielding coverage is provided in the transition regions.

Fully enclosing a signal pair in reference conductors in the intermediate regions may create effects that undesirably impact signal integrity, particularly when used in connection with a transition between edge coupling and broadside coupling within a module. The reference conductors surrounding the signal pair may form a waveguide. Signals on the pair, and particularly within a transition region between edge coupling and broadside coupling, may cause energy from the differential mode of propagation between the edges to excite signals that can propagate within the waveguide. In accordance with some embodiments, one or more techniques to avoid exciting these undesired modes, or to suppress them if they are excited, may be used.

Some techniques that may be used to increase the frequency that will excite the undesired modes. In the embodiment illustrated, the reference conductors may be shaped to leave openings 832. These openings may be in the narrower wall of the enclosure. However, in embodiments in which there is a wider wall, the openings may be in the wider wall. In the embodiment illustrated, openings 832 run parallel to the intermediate portions of the signal conductors and are between the signal conductors that form a pair. These slots lower the angular extent of the shielding, such that, adjacent the broadside coupled intermediate portions of the signal conductors, the angular extent of the shielding may be less than 360 degrees. It may, for example, be in the range of 355 of less. In embodiments in which members 900A and 900B are formed by over molding lossy material on the modules, lossy material may be allowed to fill openings 832, with or without extending into the inside of the waveguide, which may suppress propagation of undesired modes of signal propagation, that can decrease signal integrity.

In the embodiment illustrated in FIG. 8, openings 832 are slot shaped, effectively dividing the shielding in half in intermediate region 830. The lowest frequency that can be excited in a structure serving as a waveguide, as is the effect of the reference conductors that substantially surround the signal conductors as illustrated in FIG. 8, is inversely proportional to the dimensions of the sides. In some embodiments, the lowest frequency waveguide mode that can be excited is a TEM mode. Effectively shortening a side by incorporating slot-shaped opening 832, raises the frequency of the TEM mode that can be excited. A higher resonant frequency can mean that less energy within the operating frequency range of the connector is coupled into undesired propagation within the waveguide formed by the reference conductors, which improves signal integrity.

In region 830, the signal conductors of a pair are broadside coupled and the openings 832, with or without lossy material in them, may suppress TEM common modes of propagation. While not being bound by any particular theory of operation, the inventors theorize that openings 832, in combination with an edge coupled to broadside coupled transition, aids in providing a balanced connector suitable for high frequency operation.

Figure 9:
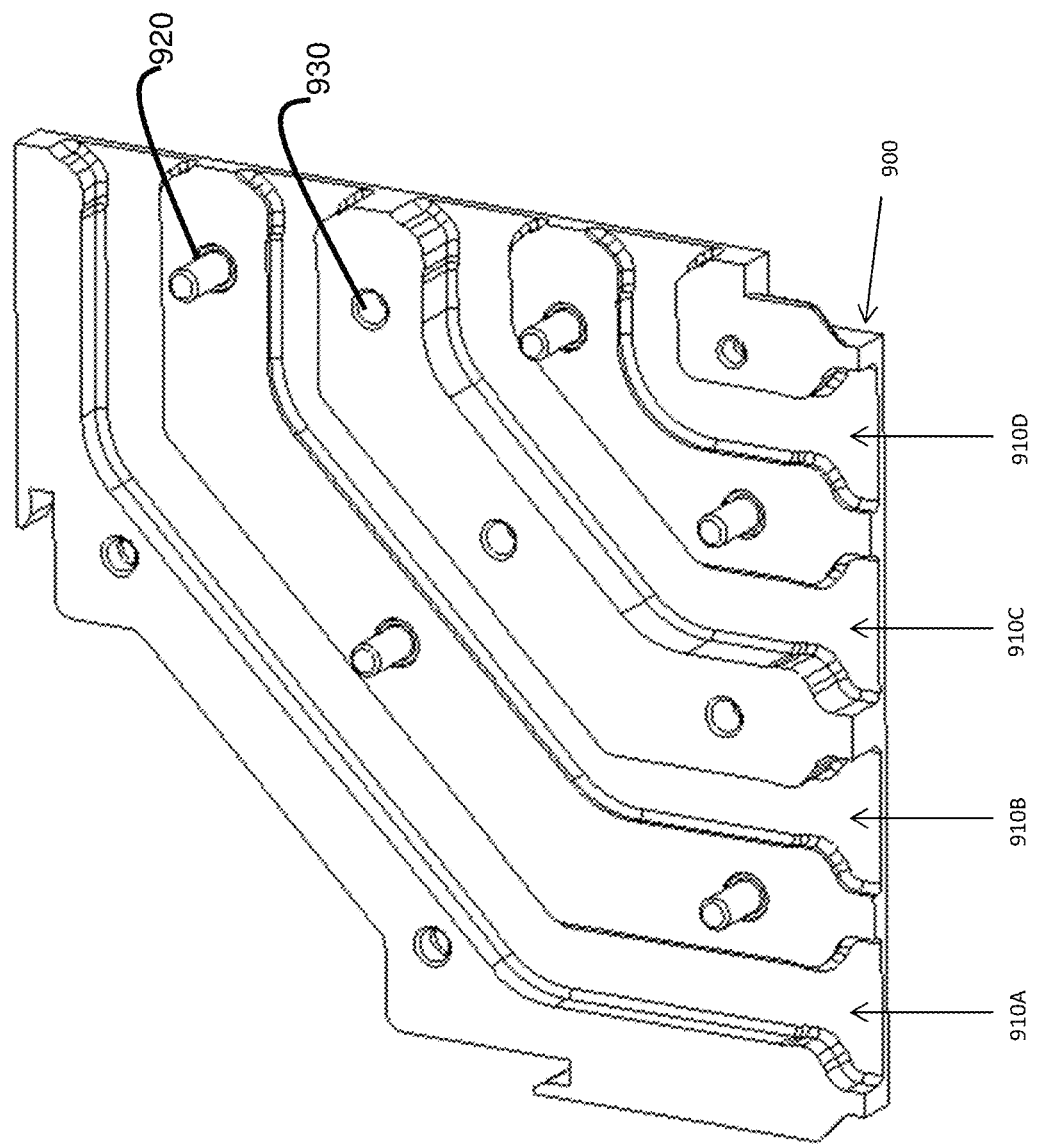
FIG. 9 is an isometric view of a portion of the housing of the wafer assembly of FIG. 7.

FIG. 9 illustrates a member 900, which may be a representation of member 900A or 900B. As can be seen, member 900 is formed with channels 910A . . . 910D shaped to receive modules 810A . . . 810D shown in FIG. 8. With the modules in the channels, member 900A may be secured to member 900B. In the illustrated embodiment, attachment of members 900A and 900B may be achieved by posts, such as post 920, in one member, passing through a hole, such as hole 930, in the other member. The post may be welded or otherwise secured in the hole. However, any suitable attachment mechanism may be used.

Members 900A and 900B may be molded from or include a lossy material. Any suitable lossy material may be used for these and other structures that are "lossy." Materials that conduct, but with some loss, or material which by another physical mechanism absorbs electromagnetic energy over the frequency range of interest are referred to herein generally as "lossy" materials. Electrically lossy materials can be formed from lossy dielectric and/or poorly conductive and/or lossy magnetic materials. Magnetically lossy material can be formed, for example, from materials traditionally regarded as ferromagnetic materials, such as those that have a magnetic loss tangent greater than approximately 0.05 in the frequency range of interest. The "magnetic loss tangent" is the ratio of the imaginary part to the real part of the complex electrical permeability of the material. Practical lossy magnetic materials or mixtures containing lossy magnetic materials may also exhibit useful amounts of dielectric loss or conductive loss effects over portions of the frequency range of interest. Electrically lossy material can be formed from material traditionally regarded as dielectric materials, such as those that have an electric loss tangent greater than approximately 0.05 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain conductive particles or regions that are sufficiently dispersed that they do not provide high conductivity or otherwise are prepared with properties that lead to a relatively weak bulk conductivity compared to a good conductor such as copper over the frequency range of interest.

Electrically lossy materials typically have a bulk conductivity of about 1 Siemen/meter to about 10,000 Siemens/meter and preferably about 1 Siemen/meter to about 5,000 Siemens/meter. In some embodiments material with a bulk conductivity of between about 10 Siemens/meter and about 200 Siemens/meter may be used. As a specific example, material with a conductivity of about 50 Siemens/meter may be used. However, it should be appreciated that the conductivity of the material may be selected empirically or through electrical simulation using known simulation tools to determine a suitable conductivity that provides a suitably low crosstalk with a suitably low signal path attenuation or insertion loss.

Electrically lossy materials may be partially conductive materials, such as those that have a surface resistivity between 1 Ω/square and 100,000 Ω/square. In some embodiments, the electrically lossy material has a surface resistivity between 10 Ω/square and 1000 Ω/square. As a specific example, the material may have a surface resistivity of between about 20 Ω/square and 80 Ω/square.

In some embodiments, electrically lossy material is formed by adding to a binder a filler that contains conductive particles. In such an embodiment, a lossy member may be formed by molding or otherwise shaping the binder with filler into a desired form. Examples of conductive particles that may be used as a filler to form an electrically lossy material include carbon or graphite formed as fibers, flakes, nanoparticles, or other types of particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure, or can otherwise be used to position the filler material. In some embodiments, the binder may be a thermoplastic material traditionally used in the manufacture of electrical connectors to facilitate the molding of the electrically lossy material into the desired shapes and locations as part of the manufacture of the electrical connector. Examples of such materials include liquid crystal polymer (LCP) and nylon. However, many alternative forms of binder materials may be used. Curable materials, such as epoxies, may serve as a binder. Alternatively, materials such as thermosetting resins or adhesives may be used.

Also, while the above described binder materials may be used to create an electrically lossy material by forming a binder around conducting particle fillers, the invention is not so limited. For example, conducting particles may be impregnated into a formed matrix material or may be coated onto a formed matrix material, such as by applying a conductive coating to a plastic component or a metal component. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Celanese Corporation which can be filled with carbon fibers or stainless steel filaments. A lossy material, such as lossy conductive carbon filled adhesive preform, such as those sold by Techfilm of Billerica, Mass., US may also be used. This preform can include an epoxy binder filled with carbon fibers and/or other carbon particles. The binder surrounds carbon particles, which act as a reinforcement for the preform. Such a preform may be inserted in a connector wafer to form all or part of the housing. In some embodiments, the preform may adhere through the adhesive in the preform, which may be cured in a heat treating process. In some embodiments, the adhesive may take the form of a separate conductive or non-conductive adhesive layer. In some embodiments, the adhesive in the preform alternatively or additionally may be used to secure one or more conductive elements, such as foil strips, to the lossy material.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

In some embodiments, a lossy member may be manufactured by stamping a preform or sheet of lossy material. For example, an insert may be formed by stamping a preform as described above with an appropriate pattern of openings. However, other materials may be used instead of or in addition to such a preform. A sheet of ferromagnetic material, for example, may be used.

However, lossy members also may be formed in other ways. In some embodiments, a lossy member may be formed by interleaving layers of lossy and conductive material such as metal foil. These layers may be rigidly attached to one another, such as through the use of epoxy or other adhesive, or may be held together in any other suitable way. The layers may be of the desired shape before being secured to one another or may be stamped or otherwise shaped after they are held together.

Figure 10:
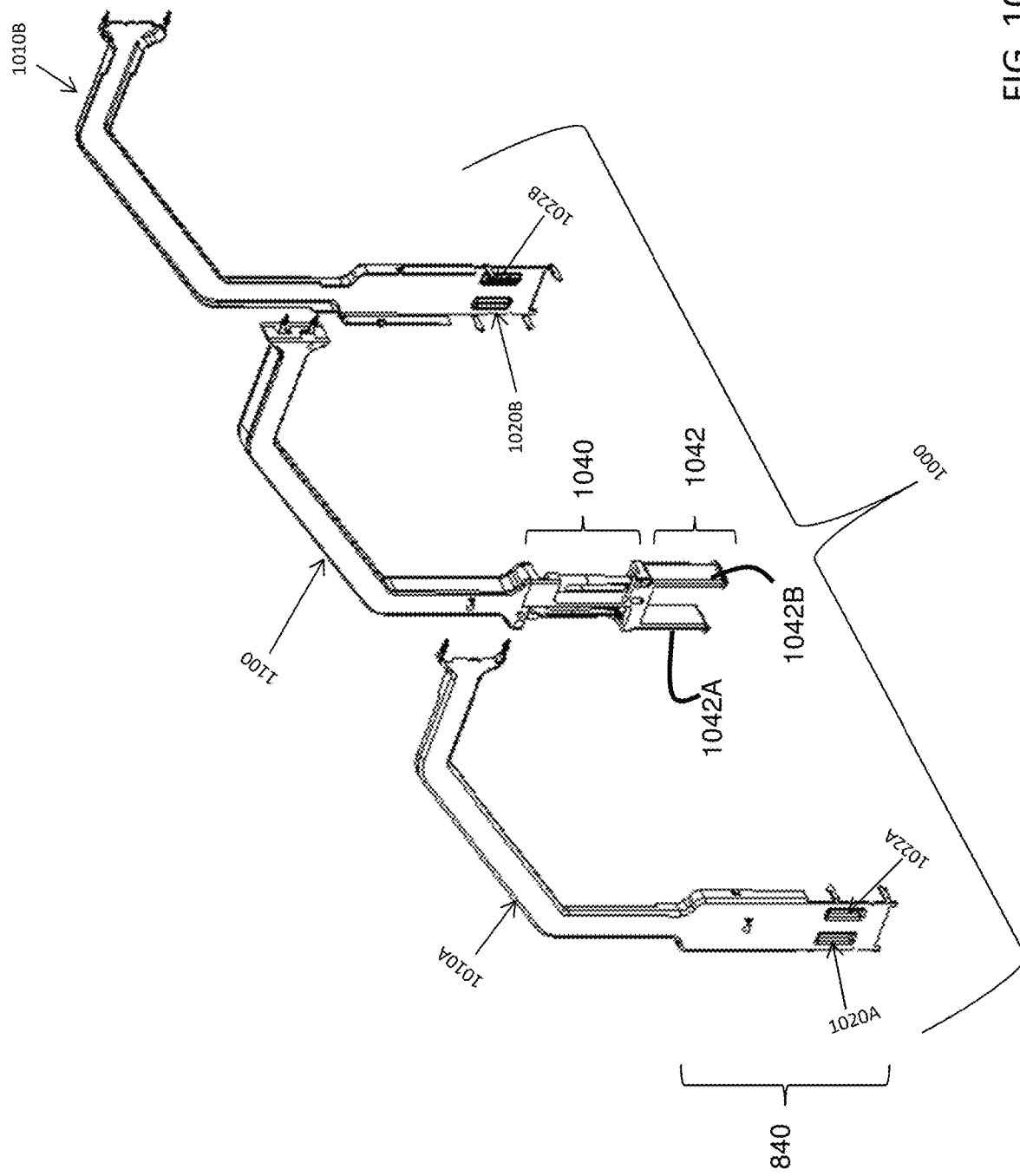
FIG. 10 is an isometric view, partially exploded, of a wafer module of the wafer assembly of FIG. 7.

FIG. 10 shows further details of construction of a wafer module 1000. Module 1000 may be representative of any of the modules in a connector, such as any of the modules 810A . . . 810D shown in FIGS. 7-8. Each of the modules 810A . . . 810D may have the same general construction, and some portions may be the same for all modules. For example, the contact tail regions 820 and mating contact regions 840 may be the same for all modules. Each module may include an intermediate portion region 830, but the length and shape of the intermediate portion region 830 may vary depending on the location of the module within the wafer.

In the embodiment illustrated, module 1000 includes a pair of signal conductors 1310A and 1310B (FIG. 13) held within an insulative housing portion 1100. Insulative housing portion 1100 is enclosed, at least partially, by reference conductors 1010A and 1010B. This subassembly may be held together in any suitable way. For example, reference conductors 1010A and 1010B may have features that engage one another. Alternatively or additionally, reference conductors 1010A and 1010B may have features that engage insulative housing portion 1100. As yet another example, the reference conductors may be held in place once members 900A and 900B are secured together as shown in FIG. 7.

The exploded view of FIG. 10 reveals that mating contact region 840 includes subregions 1040 and 1042. Subregion 1040 includes mating contact portions of module 1000. When mated with a pin module 300, mating contact portions from the pin module will enter subregion 1040 and engage the mating contact portions of module 1000. These components may be dimensioned to support a "functional mating range," such that, if the module 300 and module 1000 are fully pressed together, the mating contact portions of module 1000 will slide along the pins from pin module 300 by the "functional mating range" distance during mating.

The impedance of the signal conductors in subregion 1040 will be largely defined by the structure of module 1000. The separation of signal conductors of the pair as well as the separation of the signal conductors from reference conductors 1010A and 1010B will set the impedance. The dielectric constant of the material surrounding the signal conductors, which in this embodiment is air, will also impact the impedance. In accordance with some embodiments, design parameters of module 1000 may be selected to provide a nominal impedance within region 1040. That impedance may be designed to match the impedance of other portions of module 1000, which in turn may be selected to match the impedance of a printed circuit board or other portions of the interconnection system such that the connector does not create impedance discontinuities.

If the modules 300 and 1000 are in their nominal mating position, which in this embodiment is fully pressed together, the pins will be within mating contact portions of the signal conductors of module 1000. The impedance of the signal conductors in subregion 1040 will still be driven largely by the configuration of subregion 1040, providing a matched impedance to the rest of module 1000.

A subregion 340 (FIG. 3) may exist within pin module 300. In subregion 340, the impedance of the signal conductors will be dictated by the construction of pin module 300. The impedance will be determined by the separation of signal conductors 314A and 314B as well as their separation from reference conductors 320A and 320B. The dielectric constant of insulative portion 410 may also impact the impedance. Accordingly, these parameters may be selected to provide, within subregion 340, an impedance, which may be designed to match the nominal impedance in subregion 1040.

The impedance in subregions 340 and 1040, being dictated by construction of the modules, is largely independent of any separation between the modules during mating. However, modules 300 and 1000 have, respectively, subregions 342 and 1042 that interact with components from the mating module that could influence impedance. Because the positioning of these components could influence impedance, the impedance could vary as a function of separation of the mating modules. In some embodiments, these components are positioned to reduce changes of impedance, regardless of separation distance, or to reduce the impact of changes of impedance by distributing the change across the mating region.

When pin module 300 is pressed fully against module 1000, the components in subregions 342 and 1042 may combine to provide the nominal mating impedance. Because the modules are designed to provide a functional mating range, signal conductors within pin module 300 and module 1000 may mate, even if those modules are separated by an amount that equals the functional mating range. However, that separation between the modules can lead to changes in impedance, relative to the nominal value, at one or more places along the signal conductors in the mating region. Appropriate shape and positioning of these members can reduce that change or reduce the effect of the change by distributing it over portions of the mating region.

In the embodiments illustrated in FIG. 3 and FIG. 10, subregion 1042 is designed to overlap pin module 300 when module 1000 is pressed fully against pin module 300. Projecting insulative members 1042A and 1042B are sized to fit within spaces 342A and 342B, respectively. With the modules pressed together, the distal ends of insulative members 1042A and 1042B press against surfaces 450 (FIG. 4). Those distal ends may have a shape complementary to the taper of surfaces 450 such that insulative members 1042A and 1042B fill spaces 342A and 342B, respectively. That overlap creates a relative position of signal conductors, dielectric, and reference conductors that may approximate the structure within subregion 340. These components may be sized to provide the same impedance as in subregion 340 when modules 300 and 1000 are fully pressed together. When the modules are fully pressed together, which in this example is the nominal mating position, the signal conductors will have the same impedance across the mating region made up by subregions 340, 1040 and where subregions 342 and 1042 overlap.

These components also may be sized and may have material properties that provide impedance control as a function of separation of modules 300 and 1000. Impedance control may be achieved by providing approximately the same impedance through subregions 342 and 1042, even if those subregions do not fully overlap, or by providing gradual impedance transitions, regardless of separation of the modules.

In the illustrated embodiment, this impedance control is provided in part by projecting insulative members 1042A and 1042B, which fully or partially overlap module 300, depending on separation between modules 300 and 1000. These projecting insulative members can reduce the magnitude of changes in relative dielectric constant of material surrounding pins from pin module 300. Impedance control is also provided by projections 1020A and 1022A and 1020B and 1022B in the reference conductors 1010A and 1010B. These projections impact the separation, in a direction perpendicular to the axis of the signal conductor pair, between portions of the signal conductor pair and the reference conductors 1010A and 1010B. This separation, in combination with other characteristics, such as the width of the signal conductors in those portions, may control the impedance in those portions such that it approximates the nominal impedance of the connector or does not change abruptly in a way that may cause signal reflections. Other parameters of either or both mating modules may be configured for such impedance control.

Figure 11:
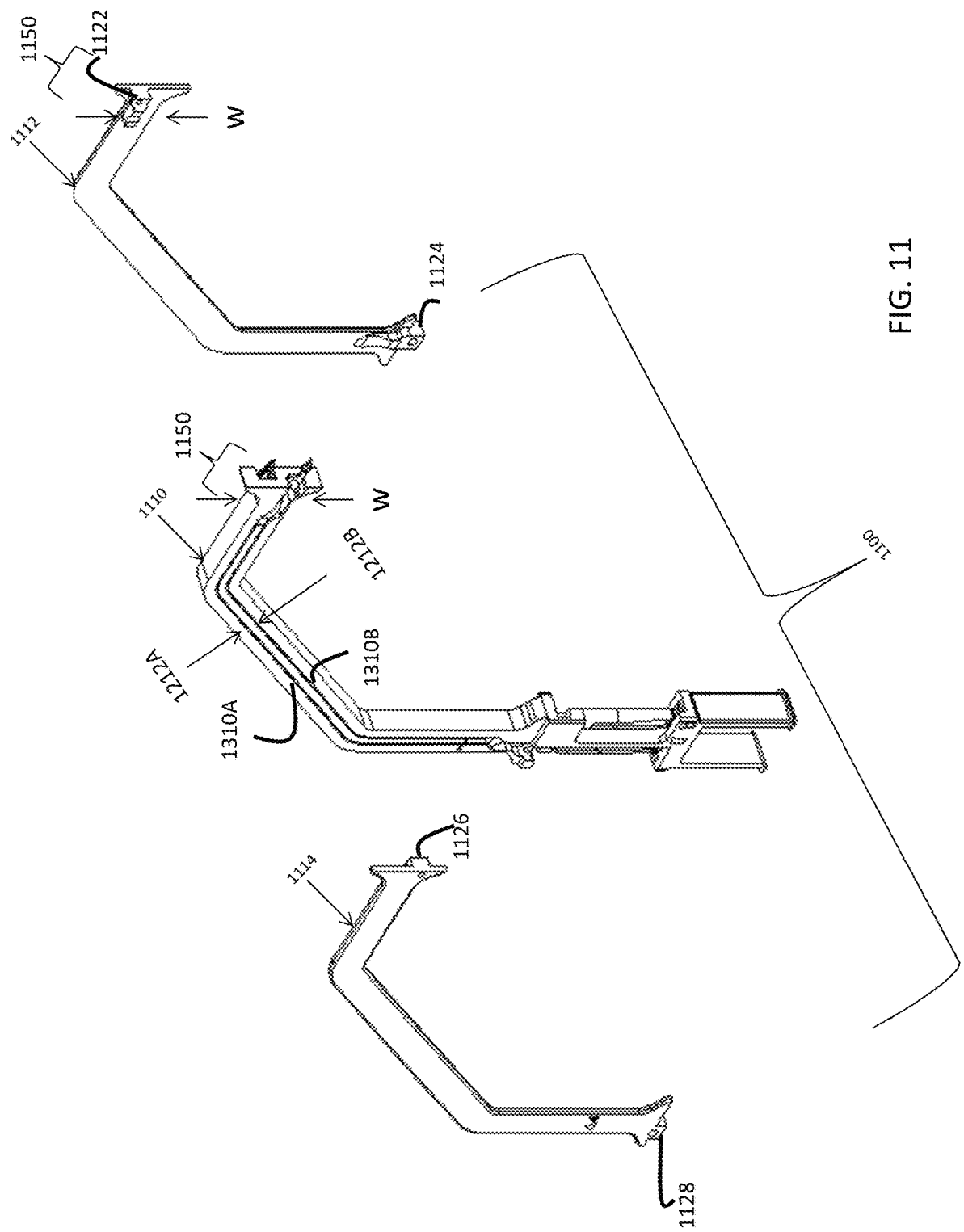
FIG. 11 is an isometric view, partially exploded, of a portion of a wafer module of the wafer assembly of FIG. 7.

Turning to FIG. 11, further details of exemplary components of a module 1000 are illustrated. FIG. 11 is an exploded view of module 1000, without reference conductors 1010A and 1010B shown. Insulative housing portion 1100 is, in the illustrated embodiment, made of multiple components that cooperate to fix the position of the signal conductors. Central member 1110 may be molded from insulative material. In the illustrated embodiment, central member 1110 includes two grooves 1212A and 1212B into which conductive elements 1310A and 1310B, which in the illustrated embodiment form a pair of signal conductors, may be inserted.

Covers 1112 and 1114 may be attached to opposing sides of central member 1110. Covers 1112 and 1114 may aid in holding conductive elements 1310A and 1310B within grooves 1212A and 1212B and with a controlled separation from reference conductors 1010A and 1010B. In the embodiment illustrated, covers 1112 and 1114 may be formed of the same material as central member 1110. However, it is not a requirement that the materials be the same, and in some embodiments, different materials may be used, such as to provide different relative dielectric constants in different regions to provide a desired impedance of the signal conductors.

In the embodiment illustrated, grooves 1212A and 1212B are configured to hold a pair of signal conductors for edge coupling at the contact tails and mating contact portions. Over a substantial portion of the intermediate portions of the signal conductors, the pair is held for broadside coupling. To transition between edge coupling at the ends of the signal conductors to broadside coupling in the intermediate portions, a transition region may be included in the signal conductors. Grooves in central member 1110 may be shaped to provide the transition region in the signal conductors. Projections 1122, 1124, 1126 and 1128 on covers 1112 and 1114 may press the conductive elements against central portion 1110 in these transition regions.

In the embodiment illustrated in FIG. 11, it can be seen that the transition between broadside and edge coupling occurs over a region 1150. At one end of this region, the signal conductors are aligned edge-to-edge in the column direction in a plane parallel to the column direction. Traversing region 1150 in towards the intermediate portion, the signal conductors jog in opposite directions perpendicular to that plane and jog towards each other in directions parallel to that plane. As a result, at the end of region 1150, the signal conductors are in separate planes parallel to the column direction. The intermediate portions of the signal conductors are aligned in a direction perpendicular to those planes.

Region 1150 includes the transition region, such as 822 or 842 where the waveguide formed by the reference conductor transitions from its widest dimension to the narrower dimension of the intermediate portion, plus a portion of the narrower intermediate region 830. As a result, at least a portion of the waveguide formed by the reference conductors in this region 1150 has a widest dimension of W, the same as in the intermediate region 830. Having at least a portion of the physical transition in a narrower part of the waveguide reduces undesired coupling of energy into waveguide modes of propagation.

Having full 360 degree shielding of the signal conductors in region 1150 may also reduce coupling of energy into undesired waveguide modes of propagation. Accordingly, openings 832 do not extend into region 1150 in the embodiment illustrated.

Figure 12:
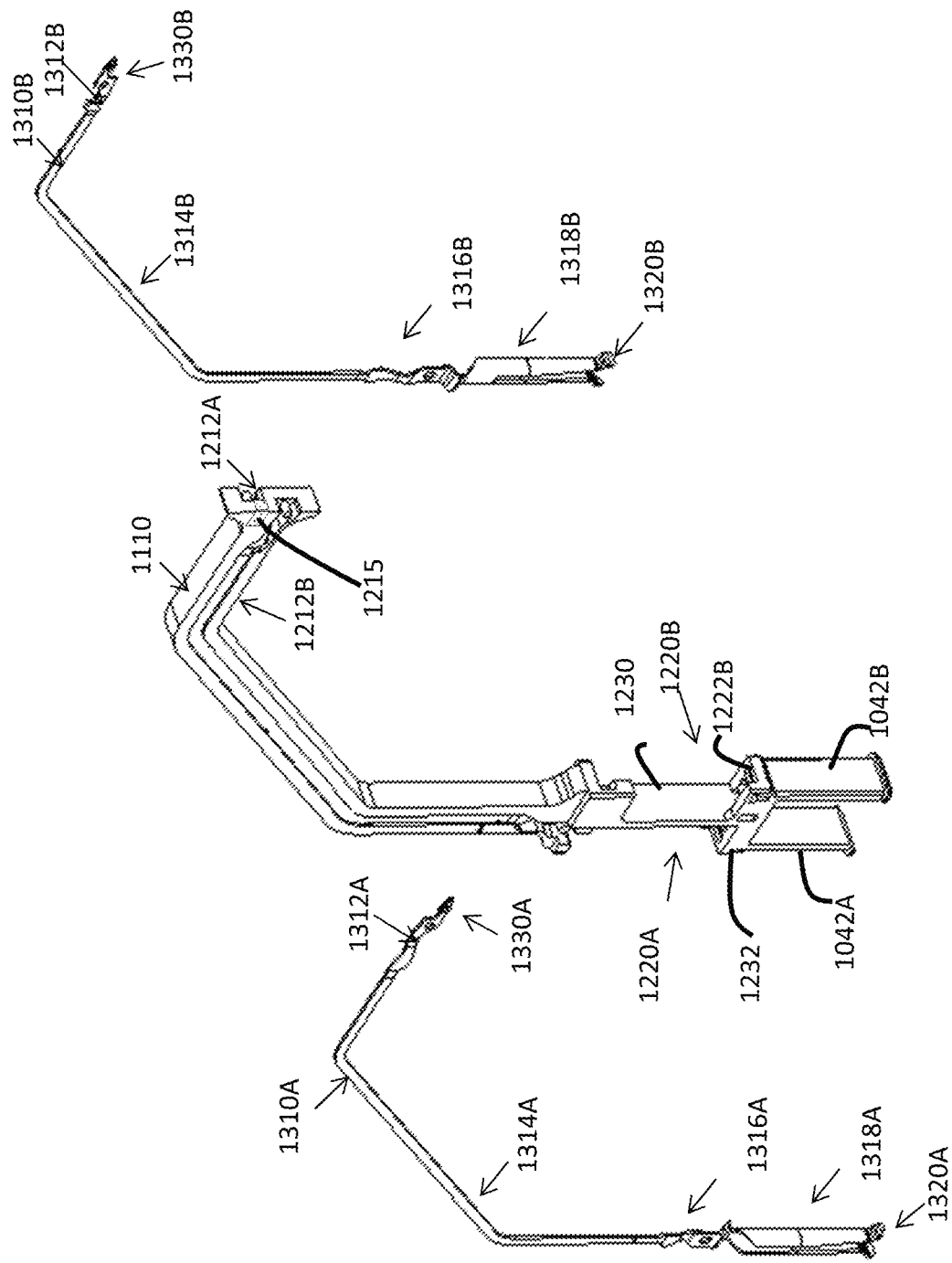
FIG. 12 is an isometric view, partially exploded, of a portion of a wafer module of the wafer assembly of FIG. 7.

FIG. 12 shows further detail of a module 1000. In this view, conductive elements 1310A and 1310B are shown separated from central member 1110. For clarity, covers 1112 and 1114 are not shown. Transition region 1312A between contact tail 1330A and intermediate portion 1314A is visible in this view. Similarly, transition region 1316A between intermediate portion 1314A and mating contact portion 1318A is also visible. Similar transition regions 1312B and 1316B are visible for conductive element 1310B, allowing for edge coupling at contact tails 1330B and mating contact portions 1318B and broadside coupling at intermediate portion 1314B.

The mating contact portions 1318A and 1318 B may be formed from the same sheet of metal as the conductive elements. However, it should be appreciated that, in some embodiments, conductive elements may be formed by attaching separate mating contact portions to other conductors to form the intermediate portions. For example, in some embodiments, intermediate portions may be cables such that the conductive elements are formed by terminating the cables with mating contact portions.

In the embodiment illustrated, the mating contact portions are tubular. Such a shape may be formed by stamping the conductive element from a sheet of metal and then rolling the mating contact portions into a tubular shape. The circumference of the tube may be large enough to accommodate a pin from a mating pin module, but may conform to the pin. The tube may be split into two or more segments, forming compliant beams. Two such beams are shown in FIG. 12. Bumps or other projections may be formed in distal portions of the beams, creating contact surfaces. Those contact surfaces may be coated with gold or other conductive, ductile material to enhance reliability of an electrical contact.

When conductive elements 1310A and 1310B are mounted in central member 1110, mating contact portions 1318A and 1318B fit within openings 1220A 1220B. The mating contact portions are separated by wall 1230. The distal ends 1320A and 1320B of mating contact portions 1318A and 1318 B may be aligned with openings, such as opening 1222B, in platform 1232. These openings may be positioned to receive pins from the mating pin module 300. Wall 1230, platform 1232 and insulative projecting members 1042A and 1042B may be formed as part of portion 1110, such as in one molding operation. However, any suitable technique may be used to form these members.

FIG. 12 shows a further technique that may be used, instead of or in addition to techniques described above, for reducing energy in undesired modes of propagation within the waveguides formed by the reference conductors in transition regions 1150. Conductive or lossy material may be integrated into each module so as to reduce excitation of undesired modes or to damp undesired modes. FIG. 12, for example, shows lossy region 1215. Lossy region 1215 may be configured to fall along the center line between signal conductors 1310A and 1310B in some or all of region 1150. Because signal conductors 1310A and 1310B jog in different directions through that region to implement the edge to broadside transition, lossy region 1215 may not be bounded by surfaces that are parallel or perpendicular to the walls of the waveguide formed by the reference conductors. Rather, it may be contoured to provide surfaces equidistant from the edges of the signal conductors 1310A and 1310B as they twist through region 1150. Lossy region 1215 may be electrically connected to the reference conductors in some embodiments. However, in other embodiments, the lossy region 1215 may be floating.

Though illustrated as a lossy region 1215, a similarly positioned conductive region may also reduce coupling of energy into undesired waveguide modes that reduce signal integrity. Such a conductive region, with surfaces that twist through region 1150, may be connected to the reference conductors in some embodiments. While not being bound by any particular theory of operation, a conductor, acting as a wall separating the signal conductors and as such twists to follow the twists of the signal conductors in the transition region, may couple ground current to the waveguide in such a way as to reduce undesired modes. For example, the current may be coupled to flow in a differential mode through the walls of the reference conductors parallel to the broadside coupled signal conductors, rather than excite common modes.

Figure 13:
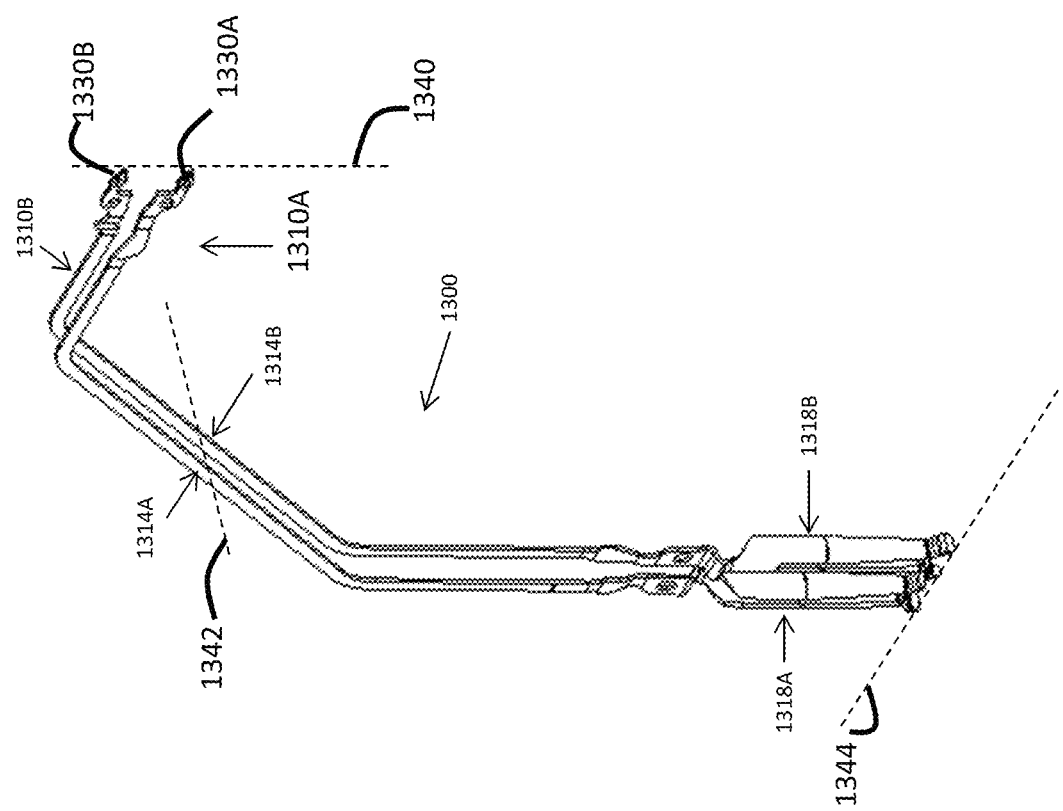
FIG. 13 is an isometric view of a pair of conducting elements of a wafer module of the wafer assembly of FIG. 7.

FIG. 13 shows in greater detail the positioning of conductive members 1310A and 1310B, forming a pair 1300 of signal conductors. In the embodiment illustrated, conductive members 1310A and 1310B each have edges and broader sides between those edges. Contact tails 1330A and 1330B are aligned in a column 1340. With this alignment, edges of conductive elements 1310A and 1310B face each other at the contact tails 1330A and 1330B. Other modules in the same wafer will similarly have contact tails aligned along column 1340. Contact tails from adjacent wafers will be aligned in parallel columns. The space between the parallel columns creates routing channels on the printed circuit board to which the connector is attached. Mating contact portions 1318A and 1318B are aligned along column 1344. Though the mating contact portions are tubular, the portions of conductive elements 1310A and 1310B to which mating contact portions 1318A and 1318B are attached are edge coupled. Accordingly, mating contact portions 1318A and 1318B may similarly be said to be edge coupled.

In contrast, intermediate portions 1314A and 1314B are aligned with their broader sides facing each other. The intermediate portions are aligned in the direction of row

1342. In the example of FIG. 13, conductive elements for a right angle connector are illustrated, as reflected by the right angle between column 1340, representing points of attachment to a daughtercard, and column 1344, representing locations for mating pins attached to a backplane connector.

In a conventional right angle connector in which edge coupled pairs are used within a wafer, within each pair the conductive element in the outer row at the daughtercard is longer. In FIG. 13, conductive element 1310B is attached at the outer row at the daughtercard. However, because the intermediate portions are broadside coupled, intermediate portions 1314A and 1314B are parallel throughout the portions of the connector that traverse a right angle, such that neither conductive element is in an outer row. Thus, no skew is introduced as a result of different electrical path lengths.

Moreover, in FIG. 13, a further technique for avoiding skew is introduced. While the contact tail 1330B for conductive element 1310B is in the outer row along column 1340, the mating contact portion of conductive element 1310B (mating contact portion 1318 B) is at the shorter, inner row along column 1344. Conversely, contact tail 1330A conductive element 1310A is at the inner row along column 1340 but mating contact portion 1318A of conductive element 1310A is in the outer row along column 1344. As a result, longer path lengths for signals traveling near contact tails 1330B relative to 1330A may be offset by shorter path lengths for signals traveling near mating contact portions 1318B relative to mating contact portion 1318A. Thus, the technique illustrated may further reduce skew.

Figure 14:
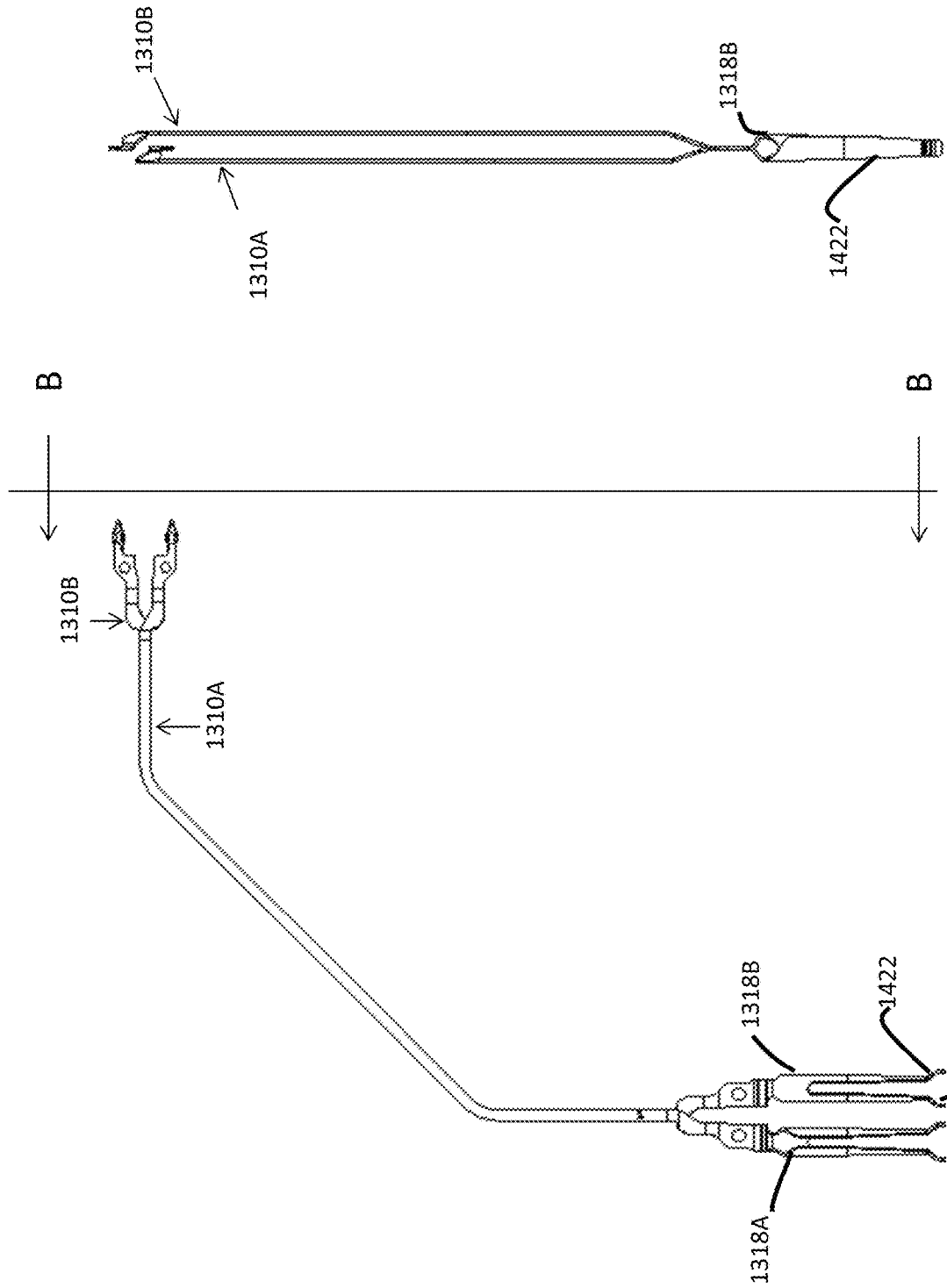
FIG. 14A is a side view of the pair of conducting elements of FIG. 13.
FIG. 14B is an end view of the pair of conducting elements of FIG. 13 taken along the line B-B of FIG. 14 A.

FIGS. 14A and 14B illustrate the edge and broadside coupling within the same pair of signal conductors. FIG. 14A is a side view, looking in the direction of row 1342. FIG. 14B is an end view, looking in the direction of column 1344. FIGS. 14A and 14B illustrate the transition between edge coupled mating contact portions and contact tails and broadside coupled intermediate portions.

Additional details of mating contact portions such as 1318A and 1318B are also visible. The tubular portion of mating contact portion 1318A is visible in the view shown in FIG. 14A and of mating contact portion 1318B in the view shown in FIG. 14B. Beams, of which beams 1420 and 1422 of mating contact portion 1318B are numbered, are also visible.

The inventors have recognized and appreciated that high frequency signals being carried on the signal conductors (e.g., 1314A&B) cause non-uniformly distributed electric fields. Additionally, where the electric field interacts with dielectric material supporting the signal conductors, substantial dielectric loss may be experienced by a high frequency, e.g. 14, 24, or 40 GHz, signal. This dielectric loss may be mitigated by removing dielectric material near the signal conductors. In particular, portions of the signal conductors may be proximate to regions of higher electric field intensity, which would cause higher dielectric loss. These portions of the signal conductor may be suspended in one or more openings in the dielectric material. The openings may be defined by and/or abut one or more pedestals in the dielectric material that is coupled to the signal conductor.

Figure 15:
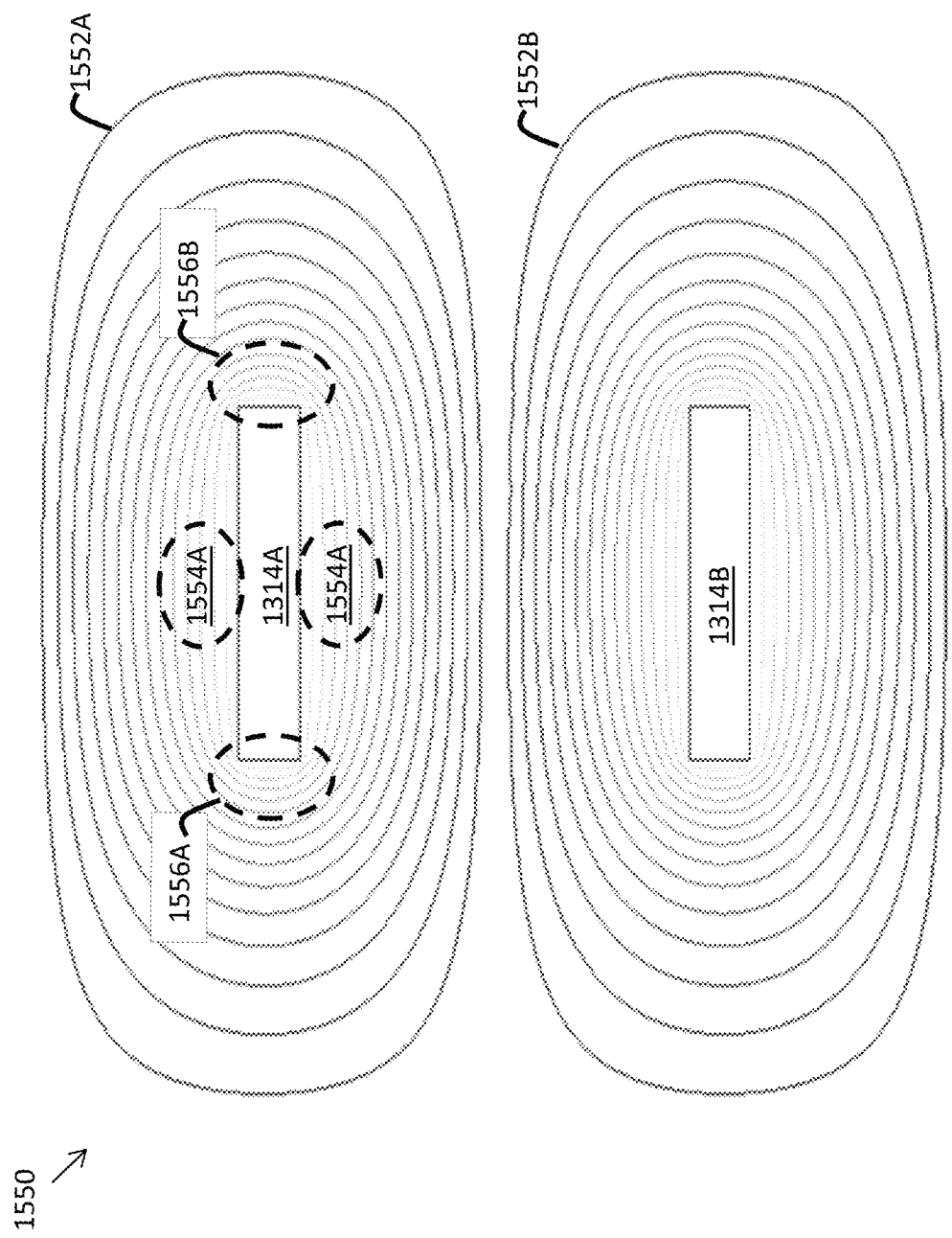
FIG. 15 is a cross-sectional view of a pair of conducting elements with equipotential lines.

FIG. 15 is a cross-sectional view of a pair 1550 of signal conductors 1314A&B. FIG. 15 illustrates equipotential lines (e.g., 1552A&B) when the pair is excited by a low voltage differential signal, such as a 50 mV signal. Each equipotential line illustrates points that have the same potential as other points identified by the same line. For clarity, not all equipotential lines are labeled.

The intensity of the electric field surrounding either of the signal conductors 1314A&B is proportional to the gradient of the equipotential lines, e.g. where the equipotential lines are closer together the electric field is stronger. The inventors have recognized and appreciated that the electric fields associated with propagation of a differential signal through a pair of signals conductors may contribute to more dielectric loss than heretofore appreciated. Dielectric loss results from the electric field interacting with the molecules of the dielectric that may be proximate to the signal conductors 1314A&B. While not being bound by any particular theory of operation, it is believed that the electric field can polarize the molecules in the dielectric, causing them to align with the electric field. As the signals carried on the signal conductors 1314A&B oscillate, the electric field changes correspondingly, requiring the molecules in the dielectric to rotate to stay aligned with the electric field. The molecular motion required for the dielectric molecules to remain aligned with the electric field created by the signal causes energy loss. As this energy is being supplied by the signal intended to propagate through the signal conductors 1314A&B, this dielectric loss translates into signal loss (or attenuation).

The inventors have conceived of designs that reduce this signal loss by removing dielectric material from regions around signal conductors 1314A&B where the electric field is strongest and where there would therefore be the most dielectric loss. In the illustrative embodiment of FIG. 15, regions 1556A&B contain stronger electric fields than regions 1554A&B. Without being bound by any particular theory of operation, this is believed to be due to the geometry of the signal conductor 1314A because the magnitude of the electric field at a point is determined in part by the distribution of electric charge around the signal conductor 1314A and the distance between the point and the charge distribution. Configuring the dielectric material to include openings proximate to the regions 1556A&B may substantially reduce dielectric loss.

It should be appreciated the electric fields around signal conductor 1314B mirror those around the signal conductor 1314A and labels for the regions of higher electric field around signal conductor 1314B have been omitted for clarity. Furthermore, the signal conductors 1314A&B are shown in a broadside arrangement, but any suitable arrangement of signal conductors (e.g., edge coupling) may be used. In other arrangements, the regions of high electric field may have different locations relative to the signal conductors than is shown in FIG. 15. Accordingly, the locations of regions where openings in the insulative housing are provided may deviate from the examples given in FIGS. 16A-16C and 17-18. In some embodiments, the electric field intensity may be substantially impacted by interactions between the fields of two or more signal conductors. It should also be appreciated that signal conductors with rectangular cross sections are shown, but that other suitable conductor geometries may be utilized and be associated with regions of varying electric field intensity different than those shown and described.

Figure 16A:
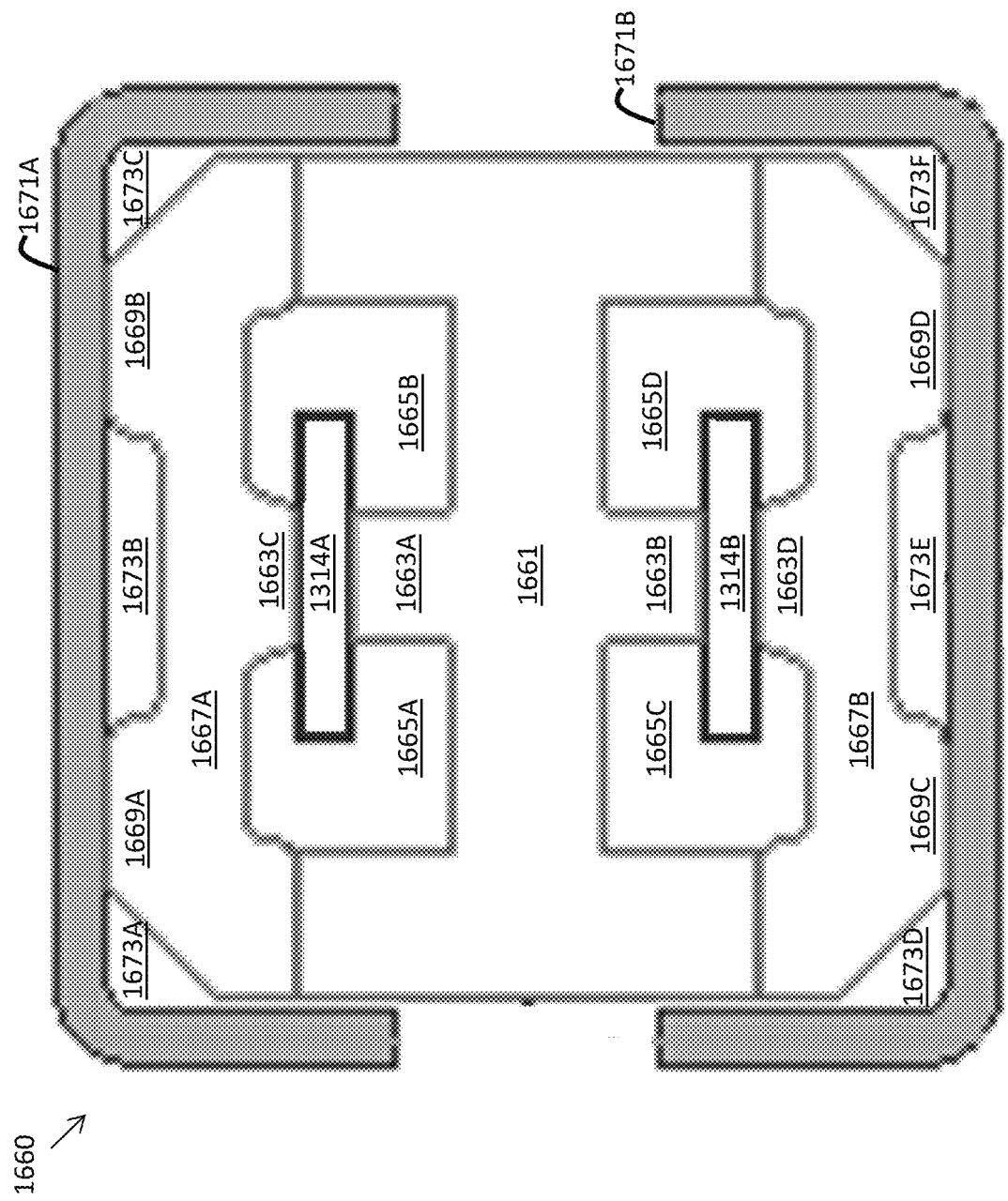
FIG. 16A is a cross-sectional view of an alternative embodiment of a wafer module of FIG. 8, along the line 16-16, configured to reduce dielectric loss, according to an illustrative embodiment.

FIG. 16A is a cross-sectional view through a connector module 1660 configured to reduce dielectric loss, according to an illustrative embodiment of the invention. The cross-section may be taken in the location illustrated by the line 16-16 in FIG. 8. Accordingly, the cross section may be through the intermediate portion of the signal conductors where they are broadside coupled, as shown in FIG. 16A. However, the cross section of a signal module may be uniform along substantially the entire length of the signal conductors within the module. Accordingly, a connector module may have a cross section as shown in FIG. 16A over at least 85% of the length of the signal conductors within the module. In some embodiments, that cross section with be over 90% or over 95% of the length of the signal conductors within the module.

In the embodiment illustrated, module 1660 may differ from module 810A in that it is arranged to reduce dielectric loss in the signal conductors 1314A&B by providing openings 1665A-D around areas of relatively intense electric fields. That configuration may be provided by using insulative members as described below in place of central member 1110 and covers 1112 and 1114 in each wafer module in the connector. Module 1660 may otherwise be configured like and be used in a connector with any or all of the features described herein.

The signal conductors 1314A&B may be any suitable signal conductors, for example those discussed with reference to other aspects of the present disclosure such as FIGS. 8 and 10-15. However, in some embodiments, the openings in the dielectric around the signal conductors enables larger signal conductors 1314A&B to be used without changing the total impedance of the signal conductors in the module, which reduces signal loss in the conductors. In the illustrative embodiment, the signal conductors 1314A&B are broadside coupled, but any suitable coupling or arrangement may be used. The signal conductors 1314A&B may carry any suitable differential and/or high frequency signals, thereby creating electrical potentials and fields, for example as was discussed with reference to FIG. 15.

Openings 1665A-D represent space created by the insulative support members (e.g., 1661 and 1667A&B), which may be filled with air or other material having lower dielectric loss than the insulative material forming the insulative members. Having an air gap around the ends of the signal conductors 1314A&B, where the electric field caused by the signal is strongest, has been found to effectively limit the dielectric loss while providing adequate support to stably maintain the signal conductors 1314A&B. For example, the selective positioning of the openings 1165A-D with respect to the regions of higher electric field strength caused by a 40 GHz low voltage (e.g. 50 mV) differential signal may prevent 0.5 dB, 1 dB, 3 dB, 5 dB, or more dielectric loss that would occur if the openings 1665A-D were filled with the material of central member 1661 and/or covers 1667A&B. In other embodiments or at other frequencies, such as 14 GHz, the loss may be 10-15% less with openings than without. The openings 1665A-D may be sized proportionally to the conductor and have square, rectangular, circular, or any other suitable geometries. For example, the openings 1665A-D may be substantially square with sides that are twice, 3×, 4×, 5× or more times the thickness of the conductor. The openings may be sized relative to the magnitude of the electric field, for example to remove material from areas with electric field intensity above a threshold. In some embodiments, the openings 1665A-D may be porous areas in the dielectric material. In some embodiments, each of the openings 1665A-D may include several smaller openings, such as smaller squares, slits, a collection of hollow cells, or any other suitable arrangement.

The module 1660 includes central member 1661 and covers 1667A&B configured to position the signal conductors 1314A&B within the openings 1665A-D. Collectively, the central member 1661 and covers 1667A&B may be referred to as one or more insulative support members and may form a structure for holding the length of signals conductors, for example as was discussed with reference to insulative housing portion 1100 and FIG. 11. The insulative support members may be formed from any suitable insulative material that allows the insulative support members to structurally cooperate to align the signal conductors 1314A&B.

The central member 1661 includes pedestals 1663A&B that are configured to support the signal conductors 1314A&B in the openings 1665A-D. In the illustrative embodiment, the pedestals 1663A-B standoff from the remainder of the central member 1661 and define the openings 1665A-D. The pedestals 1663A-D may have any suitable width for supporting the signal conductors 1314A&B. For example, the pedestals 1663A-D have a width that is 90%, 80%, 50%, 25% or less of the width of the signal conductors 1314A-B. In some embodiments, the signal conductors 1314A&B and the pedestals 1663A-D may be configured such that at least 10% of the width of each signal conductor extends into one of the openings 1665A-D. In some embodiments, the pedestals 1663A&B are arranged to align the signal conductors 1314A&B. In some embodiments, the central member 1661 comprises support elements within one or more portions of the openings 1665A-D for aligning the signal conductors 1314A&B within the remaining portions of the openings 1665A-D. In the configuration illustrated, pedestals 1163A and 1663B establish the spacing between signal conductors 1314A&B, as covers 1667A&B are configured to press signal conductors 1314A&B against pedestals 1163A and 1663B, respectively.

The covers 1667A&B may be positioned on opposing sides of the central member 1661. In the embodiment illustrated, the coves 1667A&B may be formed of the same material as the central member 1661. However, it is not a requirement that the materials be the same, and in some embodiments, different materials may be used, such as to provide different relative dielectric constants in different regions to provide a desired impedance of the signal conductors. The pedestals 1663C&D may be configured similarly to the pedestals 1663A&B, but this is not required. In some embodiments, the pedestals 1663C&D may be the same or different widths and/or heights as any of the pedestals 1663A-D.

The covers 1667A&B may be configured to aid in holding the signal conductors 1314A&B between the pedestals 1663A&B of the central member 1661 and the pedestals 1663C&D of the covers 1667A&B. The pedestals 1663C&D may be connected to compliant portions of the covers 1667A&B. Compliance in the covers 1667A&B may allow the covers 1667A&B to pinch the signal conductors 1314A&B while also compensating for warpage or misalignment in the module 1660 assembly.

The insulative support members may be enclosed entirely or partially (as shown in FIG. 16A) by reference conductors 1671A&B. This assembly may be held together in any suitable way. For example, the reference conductors 1671A&B may have features that engage one another. Alternatively or additionally, the reference conductors 1671A&B may be held in place by exterior shields and/or lossy material used in the wafer assembly.

Figure 16B:
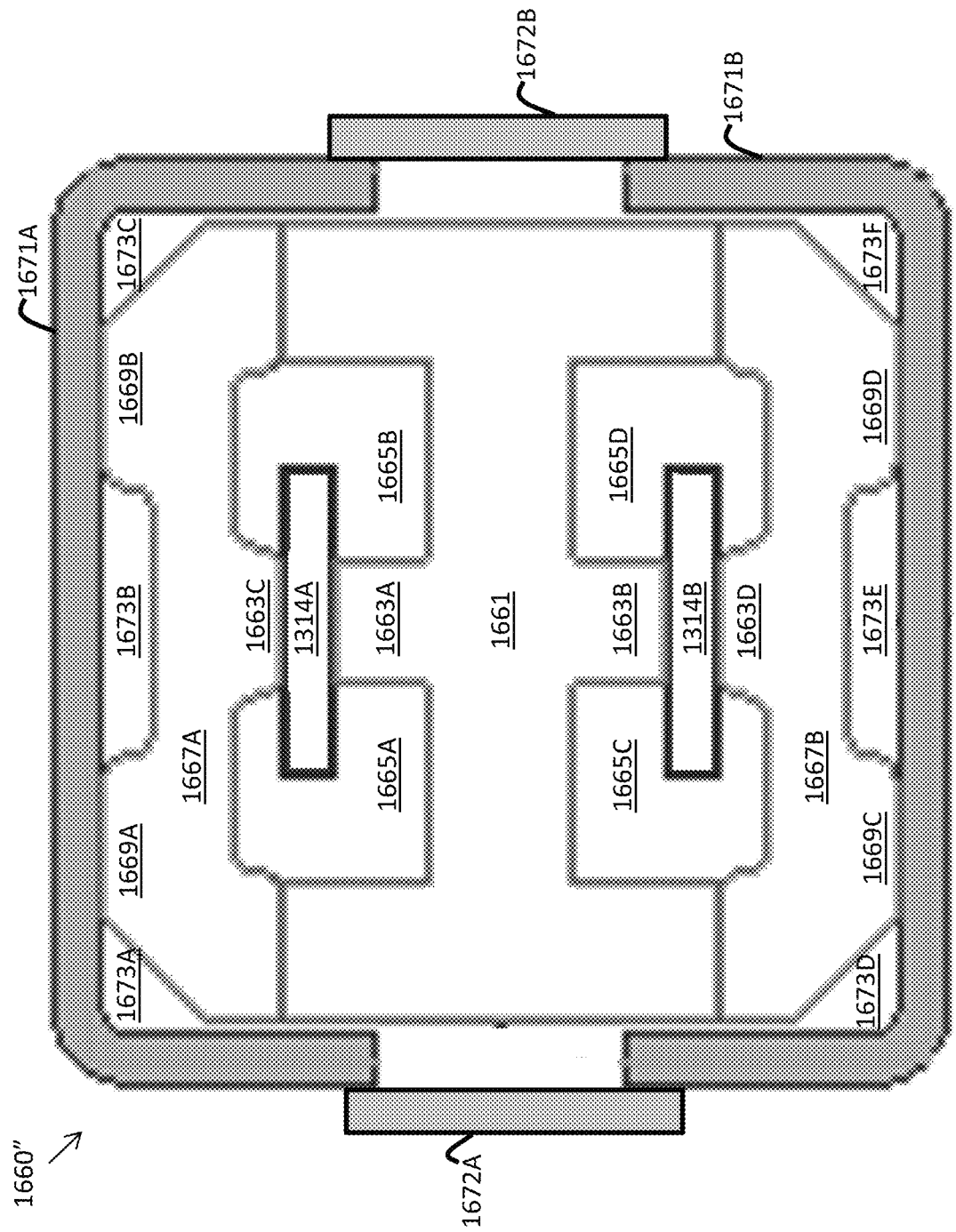
FIG. 16B is a cross-sectional view of a wafer module of FIG. 16A, at a different location than shown in FIG. 16A.

As an example of how reference conductors 1671A&B may generate force on covers 1667A&B, FIG. 16B shows a cross section through module 1660 in a different location than is shown in FIG. 16A. At the location of the cross section shown in FIG. 16B, one or both of covers 1667A&B may include latching features that hold the reference conductors 1671A&B together. Latching features 1672A and 1672B are shown schematically. The latching features may be configured to place the subassembly comprising central member 1661 and covers 1667A&B in compression. A sufficient number of latching features may be included along the length of the module to provide the required compressive force and to hold the module together. Accordingly there may be multiple such latching features along the length of the module.

In the illustrative embodiment of FIG. 16B, the covers 1667A&B are connected to the reference conductors 1617A&B by standoffs 1669A-D. These standoffs 1669A-D may be configured to limit the surface area of the covers 1667A&B that contact the reference conductors 1671A&B. This may prevent over-constraining the assembly and aid in alignment. In some embodiments, the standoffs 1669A-B may be configured to kinematically couple with the reference conductors to exactly constrain the covers 1667A&B with respect to the reference conductors 1671A&B.

In some embodiments, some portions (e.g., corners) of the covers 1667A&B are recessed from the reference conductors 1671A&B, which creates openings 1673A-F. The openings 1673A-F may limit dielectric loss since the electric field is non-zero within the reference conductors 1671A&B and may be non-negligible. Additionally, the openings 1671A-F may be advantageous for the consistent and durable assembly of the module 1660. The openings 1673A-F may allow for variability in the stamping and/or forming of the reference conductors 1671A&B, because, without such openings, the inner radius of the reference conductors 1671A&B might interfere with the insulative support members and prevent the reference conductors 1671A&B and/or additional shields from being pressed into position on and around the insulative support members.

The compressive forces, created by reference conductors 1671A&B around the insulative members positions the signal conductors with respect to each other in a vertical direction in the orientation shown in FIG. 16B. As this direction is perpendicular to the wide direction of the signal conductors and therefore the direction in which the signal conductors are most flexible. Accordingly, the cross section of the insulative members is substantially the same in the cross sections of FIGS. 16A and 16B. This same cross section may be maintained over all or substantially all of the length of the intermediate portions of the signal conductors, such as greater than 90% of the intermediate portion, or greater than 95% in some embodiments.

Figure 16C:
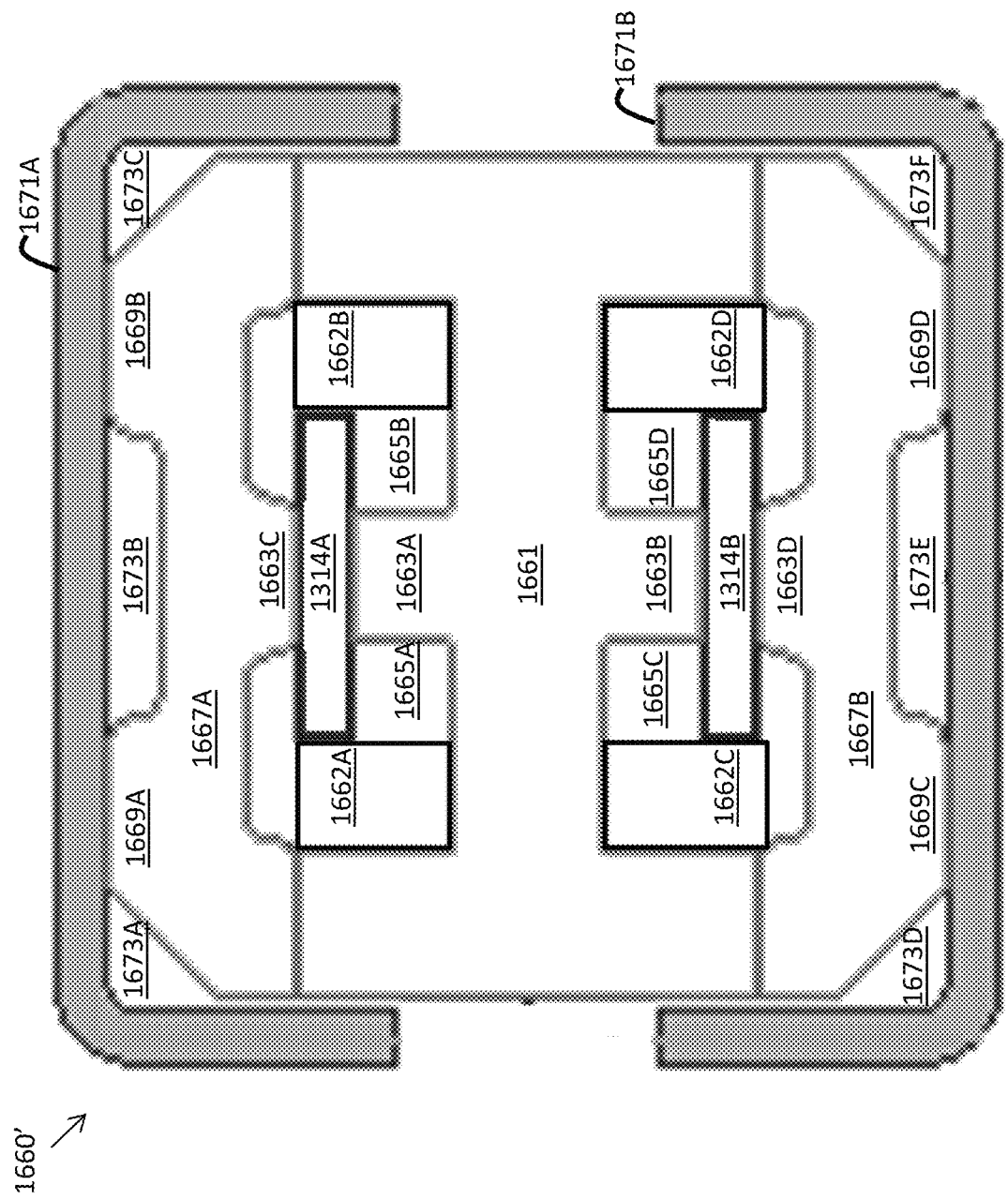
FIG. 16C is a cross-sectional view of a wafer module of FIG. 16A, at a different location than shown in FIGS. 16A and 16B.

Lateral support, positioning the signal conductors relative to each other in a direction parallel to the wide dimension of the signal conductors, is not shown in FIGS. 16A and 16B. However, lateral support of the intermediate portions of the signal conductors may be included at some locations along their length. In some embodiments, lateral support may be provided at only locations totaling a fraction of the length of the openings 1665A . . . 16665D. FIG. 16C shows a cross section of module 1660 at such a location. In the embodiment illustrated, lateral support is provided by projections 1662A . . . 1662D from the walls of the channels in central portion 1661 that form openings 1665A . . . 16665D. Projections to provide lateral support may alternatively extend from covers 1667A and 1667B or any other suitable structure may be used to provide lateral support.

In the illustrated embodiment, lateral support is not included along the full length of the intermediate portions of signal conductors 1314A&B. In some embodiments, projections 1662A . . . 1662D may be span less than 25% of the length, and in some embodiments, less than 15% or less than 10%.

Figure 17:
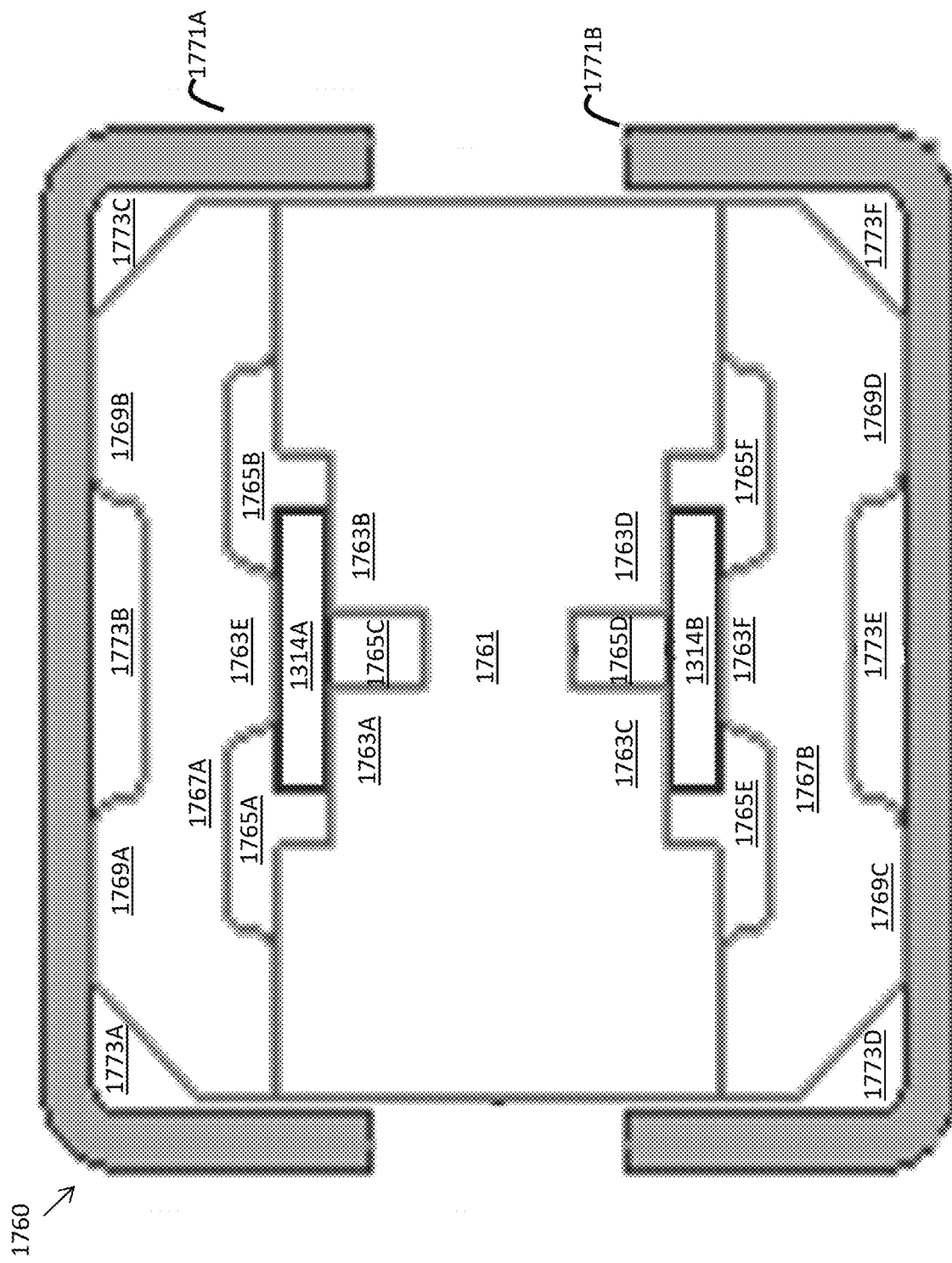
FIG. 17 is a cross-sectional view of a wafer module configured to reduce dielectric loss, according to an illustrative embodiment.

FIG. 17 is a cross-sectional view of a module 1760 with an alternative configuration of insulative members configured to reduce dielectric loss. FIG. 17 is, like FIG. 16A, a cross section, through a portion of a module without lateral support or latching features, but features as described above in connection with FIGS. 16B and 16C, or any other suitable structures performing the same functions, may be used with the configuration of FIG. 17.

In the illustrative embodiment of FIG. 17, the central member 1761 is configured to include pedestals 1763A-D, which create openings 1765A-F. Openings 1765A-B and 1765E-F remove dielectric material in regions 1556A and 1556B (FIG. 15) of high electric field and reduce dielectric loss for the same reasons as described above in connection with FIG. 16A. However, more dielectric is removed around the edges of the signal conductors in FIG. 16A, as sufficient material is removed to expose the first and second surfaces at the edges of the signal conductors in FIG. 16A, while only one such surface on each signal conductor is exposed in FIG. 17.

In some embodiments, the pedestals 1763A-B are in contact with the ends of one side of the signal conductors 1314A&B to aid in assembly and alignment. In further embodiments, the pedestals 1763A-D are recessed into the central member 1761. For example, the pedestals 1763A-D may be recessed by the thickness of the signal conductors 1314A&B such that the opposite surface of the signal conductors 1314A&B is substantially co-planar with portions of the central member 1761 that are in contact with the covers 1767A&B. There is, nonetheless, an opening in the insulative support between the edge of the signal conductor and the wall of central member 1761 where dielectric loss is reduced.

In the example of FIG. 17, the pedestals 1763A-D are additionally configured to create an opening 1765C&D near the centers of the signal conductors 1314A&B. The openings 1765C&D, in addition to eliminating some dielectric loss, may mechanically aid in assembly of the module 1760. For example the openings 1765C&D may compensate for warpage of the insulative support members or the reference shields 1771A&B, additionally the openings 1765C&D may provide compliance to relieve excess pressure on the signal conductors 1314A&B from the pedestals 1763E&F. In some embodiments, the openings 1765A-F may be sized to prevent changes or variations in size (e.g., due to assembly or temperature) from substantially changing the impedance of the module 1760.

A method of manufacturing modules (e.g., 1660 and 1760) for limiting dielectric loss may include the step of positioning a central member of an insulative support between at least two conductors. Each of the at least two conductors include a first end and a second end and an intermediate portion connecting the first end and the second end, the intermediate portion including a first edge and a second edge and a first side and a second side between the first edge and the second edge, the first and second sides being wider than the first and second edges. The at least two conductors may include a first conductor and a second conductor (e.g., 1314A&B). The central member may include a first pedestal portion and a second pedestal portion, such that the first pedestal portion contacts the first side of the first conductor and the second pedestal portion contacts the first side of the second conductor. A first cover and a second cover of the insulative support may be positioned adjacent to the first conductor and the second conductor respectively, with each of the first and second cover including respective pedestal portions. The pedestal portions of the first cover may contact the second side of the first conductor and the pedestal portion of the second cover may contact the second side of the second conductor. At least a portion of the covers and the central member may be surrounded with one or more reference conductors.

Figure 18:
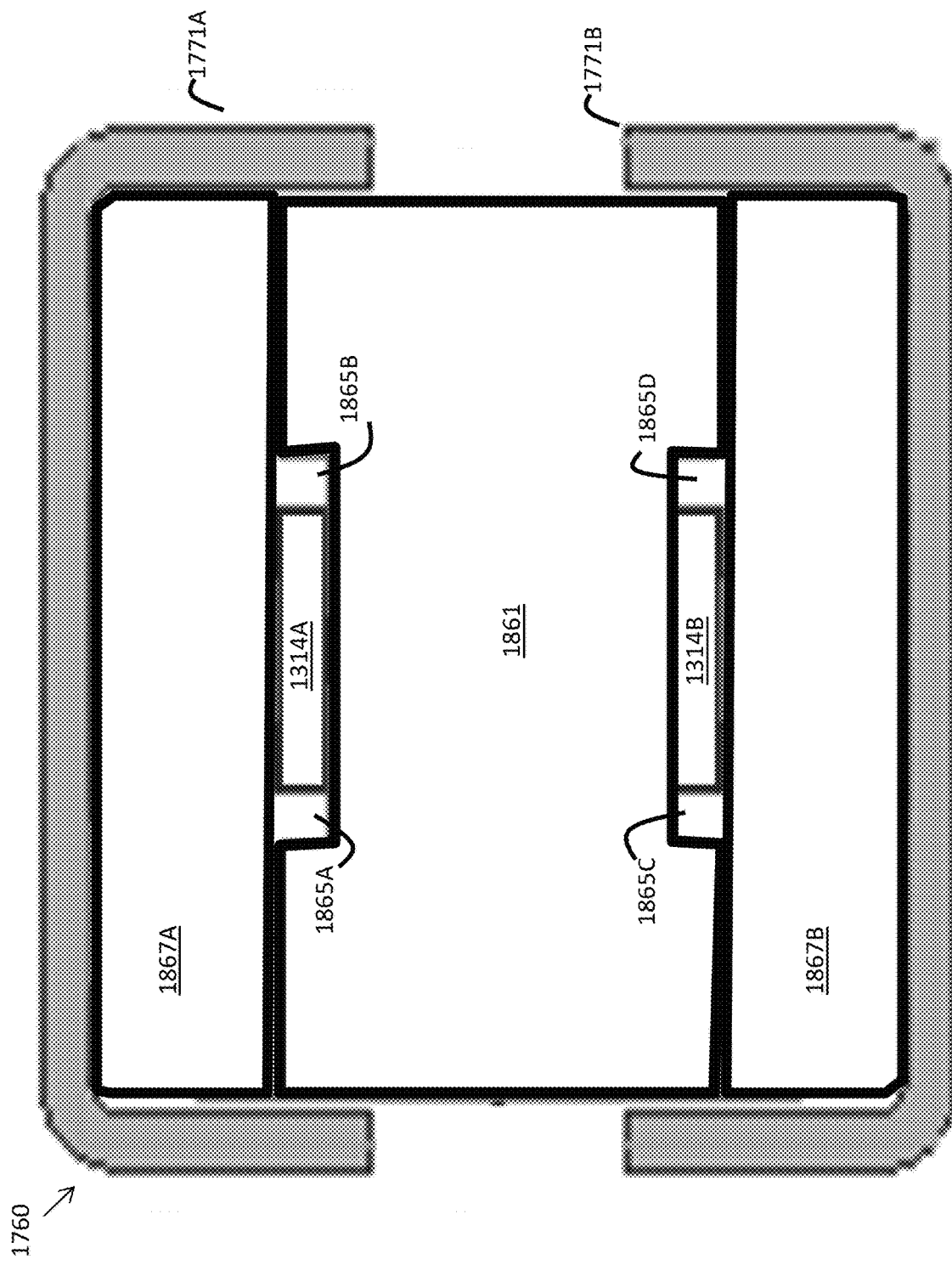
FIG. 18 is a cross-sectional view of a wafer module configured to reduce dielectric loss, according to a further illustrative embodiment.

FIG. 18 illustrates a further alternative embodiment in which a material with 1 low dielectric loss, air in the illustrated embodiment, is selectively positioned in regions of high electric fields adjacent to signal conductors. As in the embodiments illustrated in FIGS. 16A and 17, such a configuration may be created by molding plastic supports with channels or other structures that create openings adjacent the edges of the signal conductors. In FIG. 18, the signal conductors 1314A and 1314B are configured as a broadside coupled differential pairs and support members 1861 and 1867A&B are shaped with openings 1865A, 1865B, 1865C and 1865D positioned adjacent the edges of the signal conductors.

FIG. 18 represents a cross section through a module. As described above, such a module may be formed of separate insulating support members 1861 and 1867A&B with signal conductors held between support members. The support members may be molded such that the illustrated cross section exists over substantially all of the length of the signal conductors within a module. However, as shown above in connection with FIGS. 16B and 16C, other cross sections may be created at intermittent locations along the length of signal conductors, such as in locations where lateral supports for the signal conductors or latching of the shield members is provided. As with the cross section of FIG. 16A or 17, the cross section of FIG. 18 may be created over 90%, or more, of the length of the signal conductors within the module.

Openings 1865A, 1865B, 1865C and 1865D in FIG. 18 are smaller than openings 1665A, 1665B, 1665C and 1665D and openings 1765A, 1765B, 1765E and 1765F. Openings 1865A, 1865B, 1865C and 1865D expose an upper surface of 1314A and 1314B adjacent the edges, even though the lower surfaces of those conductive elements, even adjacent the edges, are resting on a plastic support. FIG. 18 illustrates that even those smaller openings can provide benefit. In some embodiments, a structure as in FIG. 18 may provide adequate performance and may provide an advantage of being easy to mold.

The embodiment of FIG. 18 also does not have openings 1673A-F as in FIG. 16A. Those openings are useful for providing springiness in insulative support members 1667A and 1667B, which aids in holding the signal conductors 1314A and 1314B firmly in place with a uniform and controlled separation dictated by the spacing between surfaces of pedestals 1663A and 1663B.

The embodiment of FIG. 18 has no openings between the broadsides of the signal conductors corresponding to openings 1765C and 1765D in FIG. 17. FIG. 18 illustrates that such opening are not required to deliver low insertion loss. However, any of the above features could be used with the structures illustrated in FIG. 18.

Figure 19:
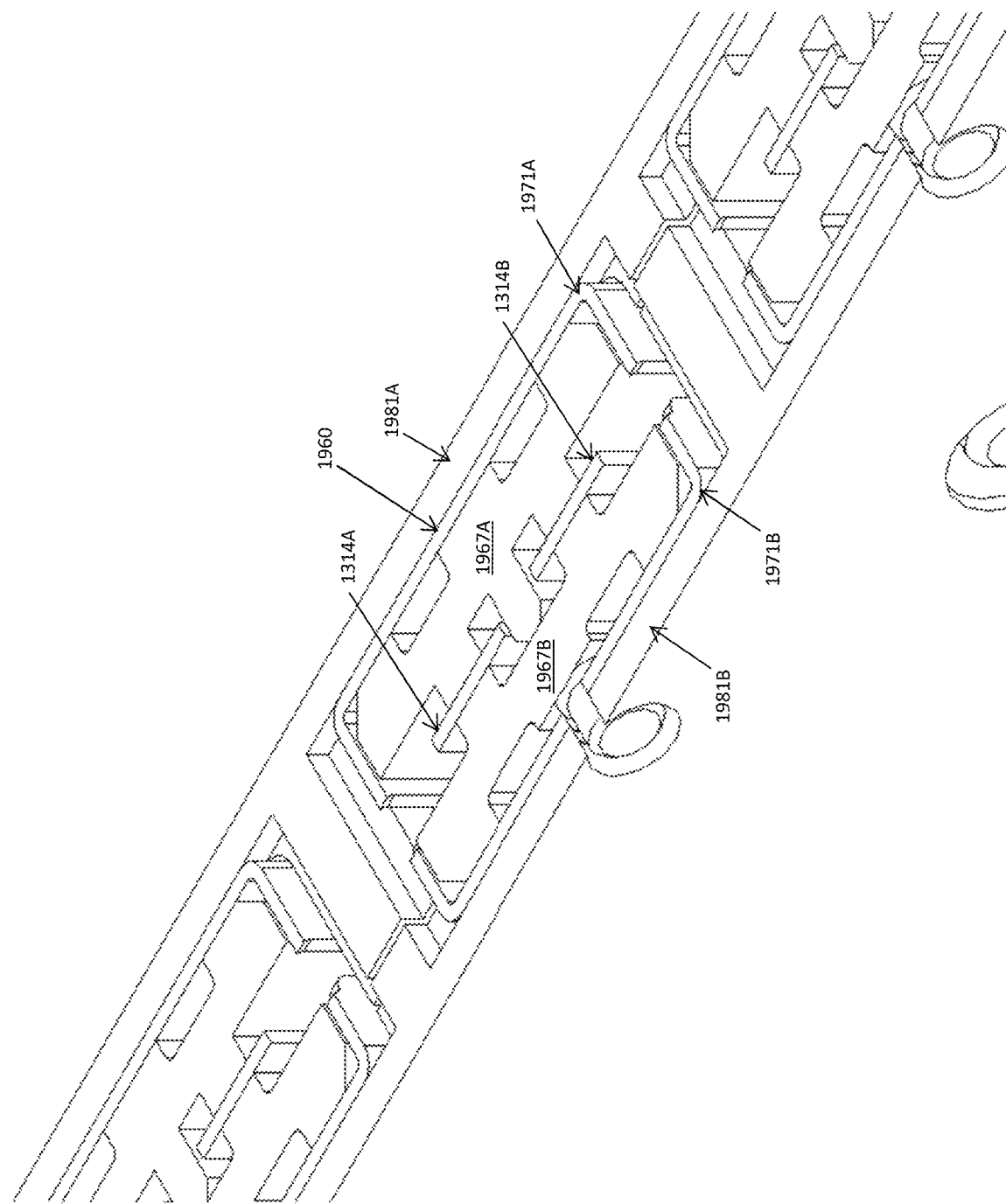
FIG. 19 is an isometric view of a wafer, partially cutaway to reveal a portion of a wafer module with edge-coupled signal conductors configured to reduce dielectric loss, according to an illustrative embodiment.

FIG. 19 is an isometric view of a wafer, partially cutaway to reveal a portion of a wafer module with edge-coupled signal conductors configured to reduce dielectric loss, according to an illustrative embodiment. The wafer module includes a connector module 1960 with an alternative configuration of insulative members configured to reduce dielectric loss. FIG. 19 may be implemented using features as described above in connection with FIGS. 16A-16C, 17, and 18; or any other suitable structures performing the same functions, may be used with the configuration of FIG. 19. In the illustrative embodiment of FIG. 19, the module 1960 is disposed between members 1981A and 1981B, which may be lossy in some embodiments or insulative in other embodiments. The module 1960 includes reference shield 1971A and 1971B, which partially surround covers 1967A and 1967B, which hold the signal conductors 1314A and 1314B.

In the illustrative embodiment of FIG. 19, the signal conductors 1314A&B are edge coupled, for example as was described earlier at least with reference to FIG. 5. The signal conductors are arranged to have adjacent edges and the sides are aligned. In the illustrative embodiment, the sides of the signal conductors 1314A&B are substantially co-linear. In the case of signal conductors with rectangular cross section, the edges may be considered to be the narrower portions of the exterior.

In the illustrative embodiment of FIG. 19, the insulative support members includes two covers 1967A&B that are configured to include pedestals to create openings, and no distinct, central insulative support member is required between the two covers 1967A&B. The covers 1967A&B are configured to create openings that remove dielectric material in regions of high electric field and reduce dielectric loss for the same reasons as described above in connection with FIG. 16A. Although the signal conductors 1314A&B are edge coupled, the inventors have recognized and appreciated that regions of high electric field may occur as was described with reference to regions 1556A and 1556B (in FIG. 15). In particular, FIG. 19 shows dielectric is removed around the edges of the signal conductors to expose the first and second surfaces at the edges of the signal conductors 1314 A&B. In some embodiments, one edge of each signal conductor 1314A&B is proximate to less dielectric material than the other corresponding edge of the same signal conductor. In some embodiments, the areas of removed dielectric may be configured as was discussed with reference to FIGS. 16A-C, 17, and 18, or according to any suitable arrangement for reducing dielectric loss.

Figure 20A:
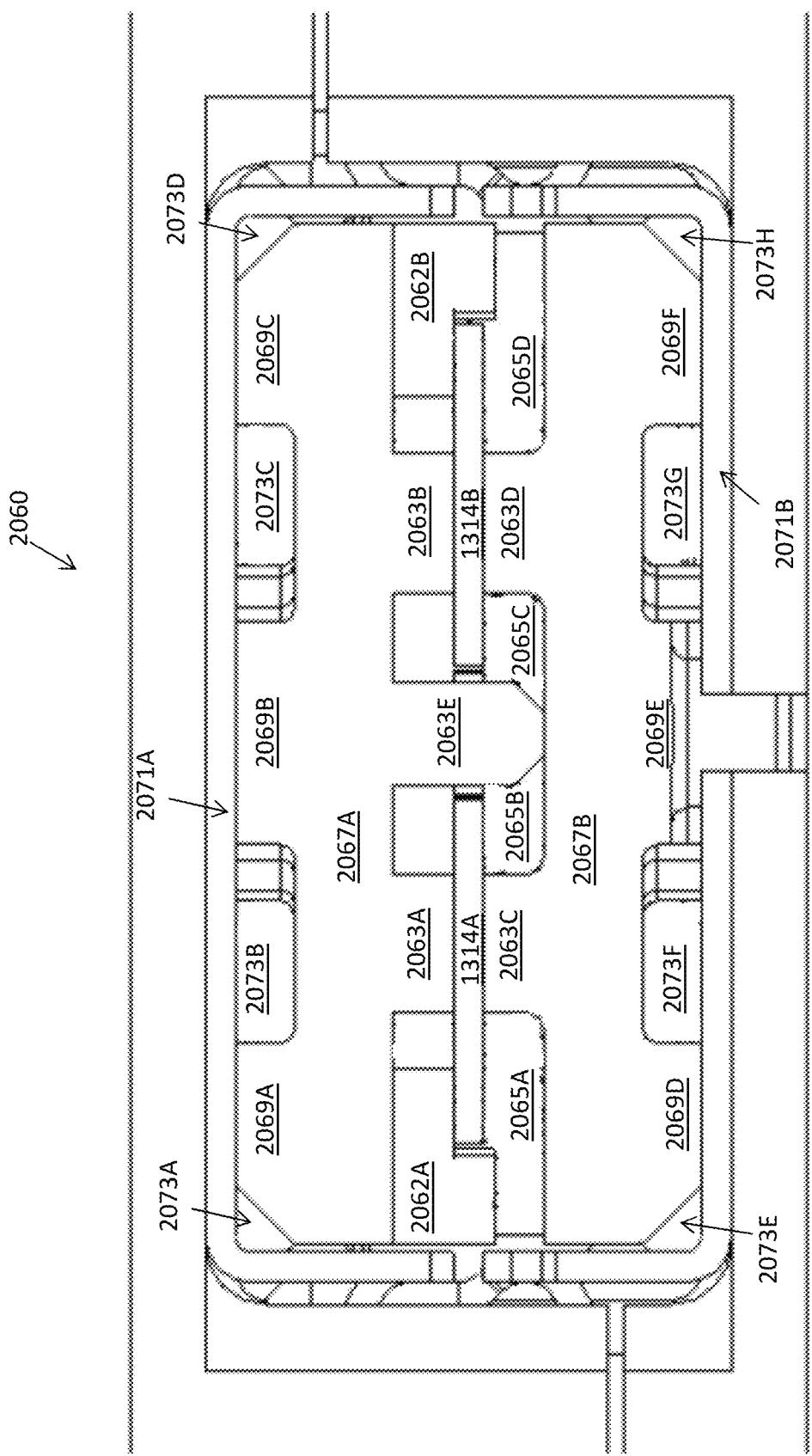
FIG. 20A is a cross sectional view of a wafer module with edge-coupled signal conductors configured to reduce dielectric loss, according to a further illustrative embodiment.

FIG. 20A is a cross sectional view of a portion of a wafer with edge-coupled signal conductors configured to reduce dielectric loss. In the example of FIG. 20A, the wafer includes a connector module 2060 with a configuration of insulative members configured to reduce dielectric loss. FIG. 20A may be implemented using features as described above in connection with FIG. 19, or any other suitable structures performing the same functions may be used with the configuration of FIG. 20A. In the illustrative embodiment of FIG. 20A, the module 2060 is disposed between lossy members. The module 2060 includes reference shield 2071A and 2071B, which surround covers 2067A and 2067B, which hold the signal conductors 1314A and 1314B. Cover 2067A includes standoffs 2069A-C as well as pedestals 2063A,B,&E. Cover 2067B includes pedestals 2063C&D and standoffs 2069D-F.

In the illustrative embodiment of FIG. 20A, the signal conductors 1314A&B are edge coupled, for example as was described earlier at least with reference to FIG. 19. The pedestals 2063A-B are in contact with a portion of one side of the signal conductors 1314A&B and the pedestals 2063C&D are in contact with portions of the opposite sides of the signal conductors 1314A&B. The projection 2063E extends between cover 2067A and cover 2067B. In some embodiments, the projection 2063E contacts the cover 2067B and spaces the insulative support members. In some embodiments, the projection 2063E does not touch the cover 2067B.

In some embodiments, the projection 2063E may be configured to contact edges of the signal conductors 1314A&B, which may provide lateral support for all or a portion of the signal conductors 1314A&B. In some embodiments, projections 2062A&B may provide lateral support and/or alignment for all or a portion of the signal conductors 1314A&B. Projections 2062A&B may function as was described with reference to projections 1662A-D.

In the example of FIG. 20A, insulative support members (2067A&B) are configured to create openings 2073A-H and openings 2065A-D. These openings, as has been described with reference to earlier FIGS. (e.g., FIG. 17) may, in addition to eliminating some dielectric loss, mechanically aid in assembly of the waveguide 2060.

Figure 20B:
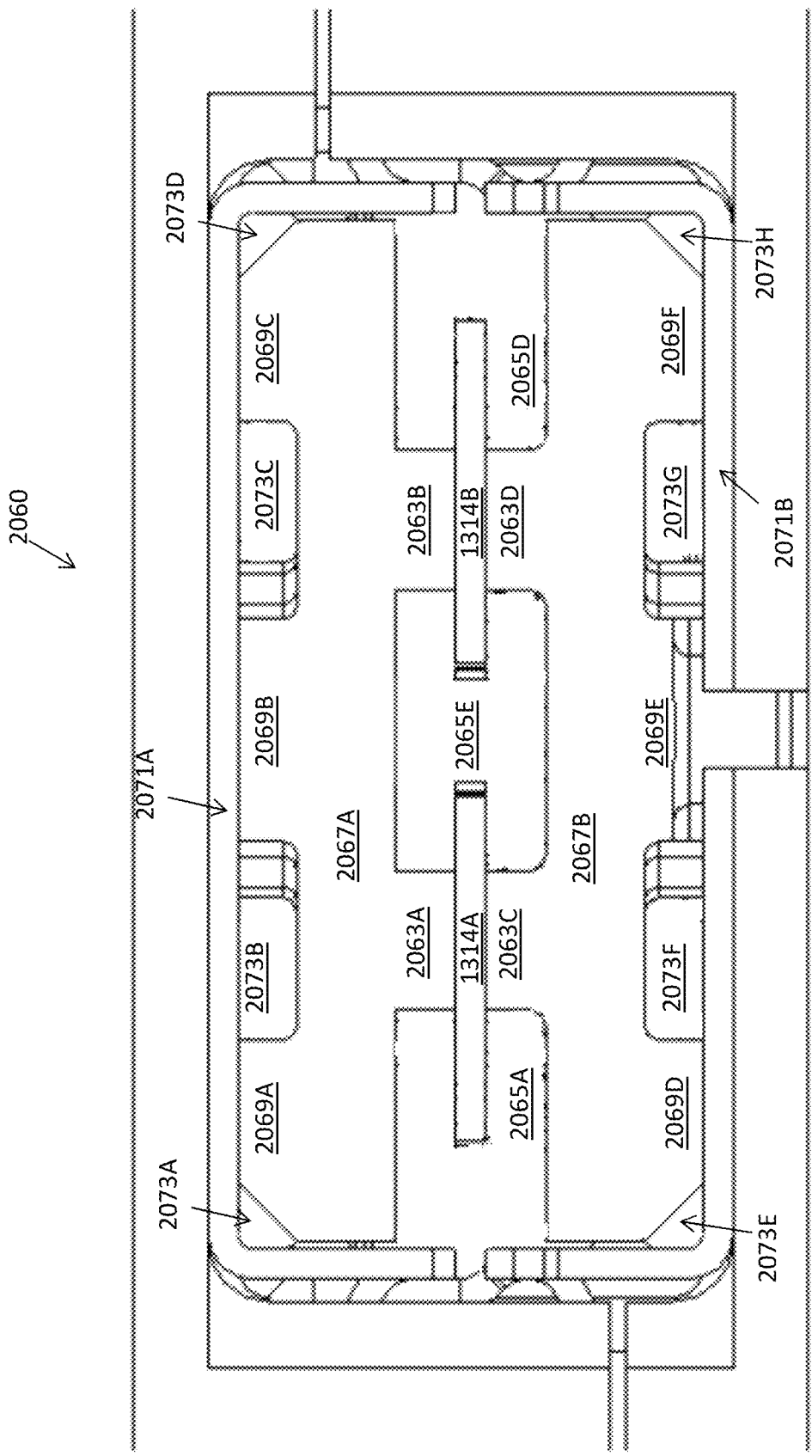
FIG. 20B is a cross sectional view of the wafer module of FIG. 20A, cross-sectioned at a different location.

FIG. 20B is a cross sectional view of a portion of a wafer with edge-coupled signal conductors configured to reduce dielectric loss, according some embodiments. FIG. 20B shows a cross section through a different portion of connector module 2060 than is illustrated in FIG. 20A. In the illustrated embodiment, connector module 2060 has a configuration of insulative members further configured to reduce dielectric loss.

In contrast with the cross section illustrated in FIG. 20A, the portion of cover 2067A&B shown in FIG. 20B do not include a pedestal between the signal conductors 1314A&B. Projections 2062A and 2062B also do not appear in this cross-section. FIG. 20A may represent a first portion of a wafer and FIG. 20B may represent a second portion of the same wafer, displaced from the first portion along the length of the same signal conductors 1314A&B. Projections, such as projection 2063E may be present at discontinuous locations along the length of the same signal conductors 1314A&B. Such projections may provide lateral alignment of the signal conductors 1314A&B. However, in order to limit dielectric loss, projection 2063E may be configured to be proximal only to one or more portions of the length of the signal conductors 1314A&B. For example, projection 2063E may be configured to span less than 25% of the length, and in some embodiments, less than 15% or less than 10%. Projections 2062A and 2062B may similarly be proximal only to one or more portions of the length of the signal conductors 1314A&B, which may be the same or different portions as projection 2063E.

Figure 21B:
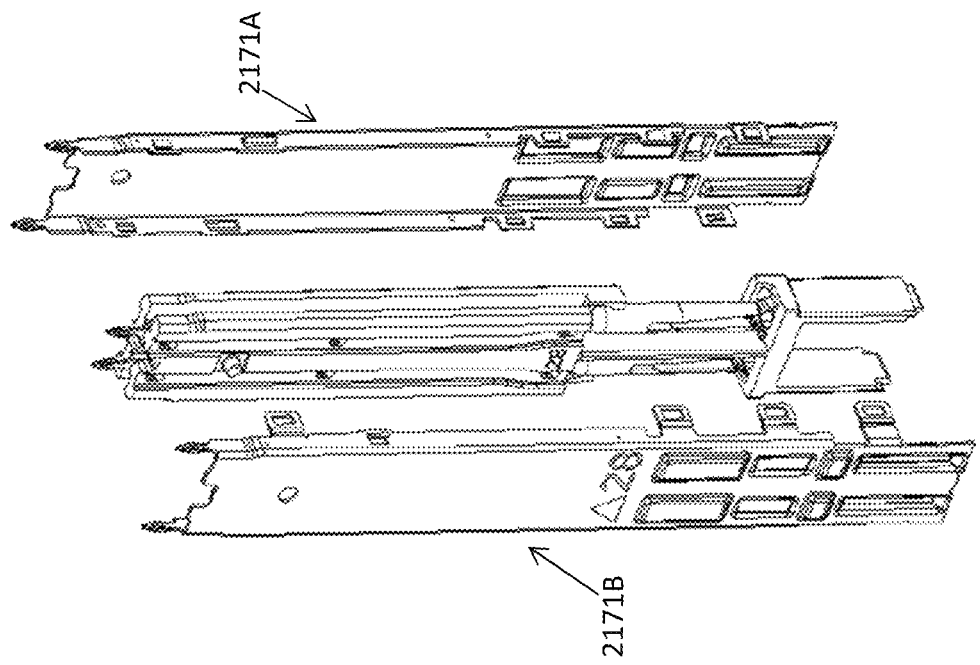
FIG. 21B is a partially exploded view of a connector module, according to an illustrative embodiment.
Figure 21A:
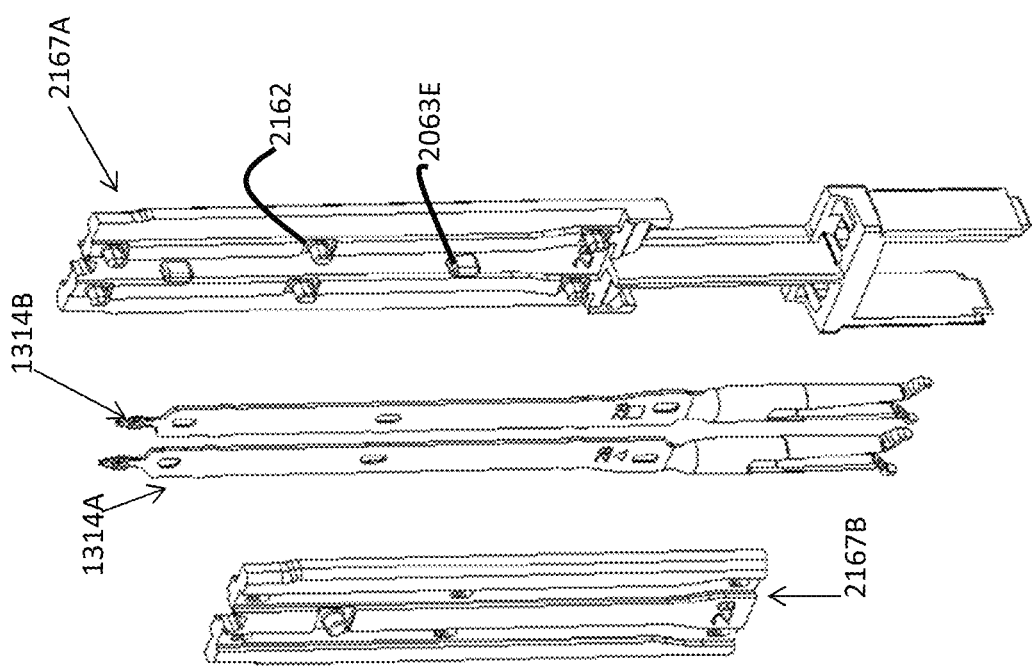
FIG. 21A is a partially exploded view of a connector module with edge-coupled signal conductors, according to an illustrative embodiment.

FIGS. 21A&B show partially exploded views of a connector module (e.g. 2060) with edge-coupled signal conductors. The signal conductors 1314A&B may be disposed between insulative support members covers 2167A&B, which may function as was described with reference to the insulative support members in at least FIGS. 19 and 20A&B. The insulative support members may be surrounded by reference conductors 2171A&B, which may function as was described with reference to any reference conductors herein.

In the configuration of FIG. 21A, it can be seen that lateral support and positioning of the signal conductors 1314A and 1314B is provided by projections 2162 that pass through holes in the signal conductors, rather than abut the sides of the signal conductors. Either or both of these mechanisms, as well as other suitable structures, may be used to position the signal conductors within a module.

Figure 22:
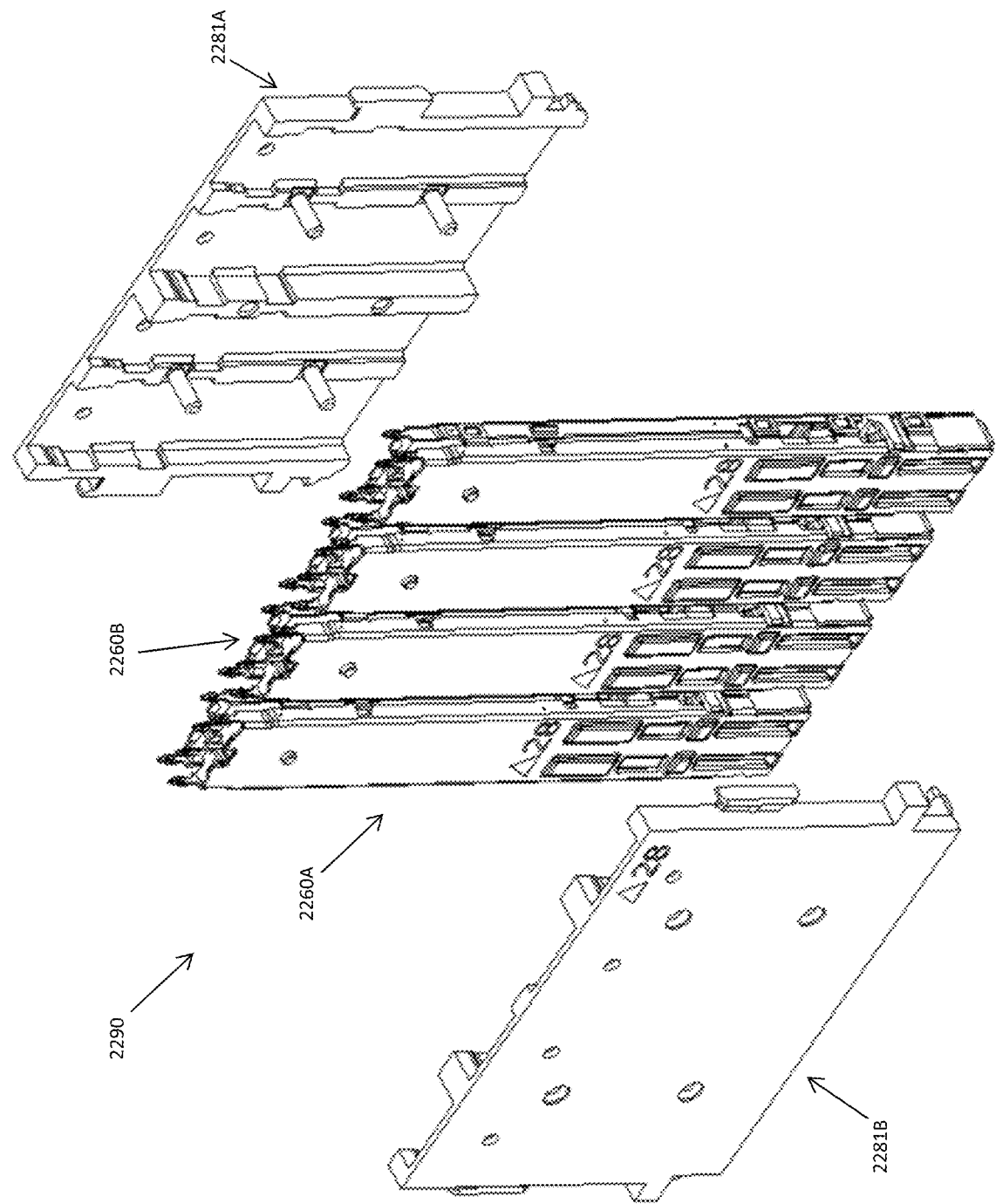
FIG. 22 is a partially exploded view of a wafer, according to an illustrative embodiment.

FIG. 22 shows a partially exploded view of a wafer 2290, according to an illustrative embodiment. The wafer module 2290 shown may be the same as and/or function as the wafer shown cross sectioned in FIG. 19. Multiple connector modules, only 2260A&B are labeled for clarity, may be covered in lossy material 2281A&B to form wafer module 2290. The connector modules 2260A&B may function as were described with reference to at least FIGS. 19 and 20A&B.

Figure 23:
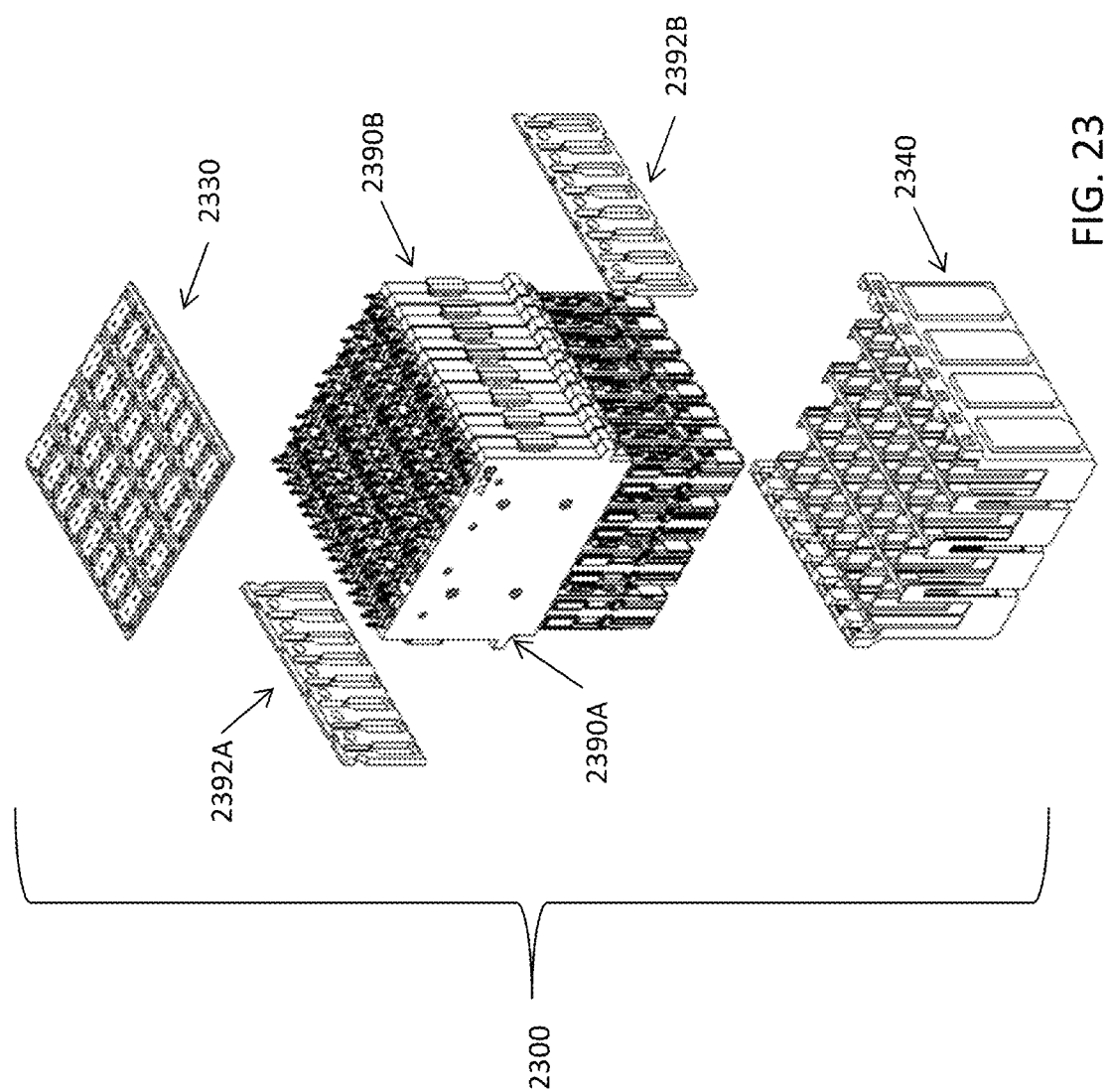
FIG. 23 is a partially exploded view of a vertical connector, according to an illustrative embodiment.

FIG. 23 shows a partially exploded view of a vertical connector 2300, according to an illustrative embodiment. The vertical connecter 2300 may include multiple wafers, including 2390A&B. The wafers may be constructed as was described with reference to FIG. 22. The wafers may be assembled and configured to connect to the housing 2340, member 2330, and organizers 2392A&B. The organizers 2392A&B may be made of any suitable material and configured to space the wafers (e.g., 2390A&B) at suitable intervals.

Member 2330 may include insulative, lossy and/or conductive portions. In some embodiments, contact tails associated with signal conductors in the wafers (e.g., 2390A&B) may pass through insulative portions of member 2330. Contact tails associated with reference conductors may pass through lossy or conductive portions of member 2330. In some embodiments, the lossy or conductive portions may be compliant, enabling those portions to conform to and press against ground conductors within the connector 2300 and ground pads on a printed circuit board to which the connector 2300 is mounted, improving the shielding capabilities of member 2230 at the mounting interface of the connector.

Mating contact portions of the wafers (e.g., 2390A&B) are held in a front housing portion 2340. The front housing portion 2340 may be made of any suitable material, which may be insulative, lossy or conductive or may include any suitable combination or such materials. For example the front housing portion 2340 may be molded from a filled, lossy material or may be formed from a conductive material, using materials and techniques similar to those described above for the housing walls 226. In the embodiment illustrated, front housing portion 2340 has multiple passages, each positioned to receive one pair of signal conductors and associated reference conductors.

In some embodiments, pedestal portions of the insulative support are shaped to provide one or more openings in a dielectric material, and the method of manufacturing the modules may include positioning edges of the conductors in the one or more openings. The method of manufacture may also include forming wafers by, at least in part, positioning multiple lossy members so that each lossy member is electrically coupled to multiple reference conductors and aligning the plurality of wafers in parallel.

The frequency range of interest may depend on the operating parameters of the system in which such a connector is used, but may generally have an upper limit between about 10 GHz and 50 GHz, such as 25 GHz, 30 or 40 GHz, although higher frequencies or lower frequencies may be of interest in some applications. Some connector designs may have frequency ranges of interest that span only a portion of this range, such as 1 to 10 GHz or 3 to 15 GHz or 5 to 35 GHz. In some embodiments, connectors may be designed to carry signals with frequencies of 14 GHz or 24 GHz. The impact of unbalanced signal pairs, and any discontinuities in the shielding at the mounting interface may be more significant at these higher frequencies.

The operating frequency range for an interconnection system may be determined based on the range of frequencies that can pass through the interconnection with acceptable signal integrity. Signal integrity may be measured in terms of a number of criteria that depend on the application for which an interconnection system is designed. Some of these criteria may relate to the propagation of the signal along a single-ended signal path, a differential signal path, a hollow waveguide, or any other type of signal path. Two examples of such criteria are the attenuation of a signal along a signal path or the reflection of a signal from a signal path.

Other criteria may relate to interaction of multiple distinct signal paths. Such criteria may include, for example, near end cross talk, defined as the portion of a signal injected on one signal path at one end of the interconnection system that is measurable at any other signal path on the same end of the interconnection system. Another such criterion may be far end cross talk, defined as the portion of a signal injected on one signal path at one end of the interconnection system that is measurable at any other signal path on the other end of the interconnection system.

As specific examples, it could be required that signal path attenuation be no more than 3 dB power loss, reflected power ratio be no greater than −20 dB, and individual signal path to signal path crosstalk contributions be no greater than −50 dB. Because these characteristics are frequency dependent, the operating range of an interconnection system is defined as the range of frequencies over which the specified criteria are met.

Designs of an electrical connector are described herein that improve signal integrity for high frequency signals, such as at frequencies in the GHz range, including up to about 25 GHz or up to about 40 GHz, up to about 50 GHz or up to about 60 GHz or up to about 75 GHz or higher, while maintaining high density, such as with a spacing between adjacent mating contacts on the order of 3 mm or less, including center-to-center spacing between adjacent contacts in a column of between 1 mm and 2.5 mm or between 2 mm and 2.5 mm, for example. Spacing between columns of mating contact portions may be similar, although there is no requirement that the spacing between all mating contacts in a connector be the same.

While a broadside-coupled configuration may be desirable for the intermediate portions of the conductive elements, a completely or predominantly edge-coupled configuration may be adopted at a mating interface with another connector or at an attachment interface with a printed circuit board. Such a configuration, for example, may facilitate routing within a printed circuit board of signal traces that connect to vias receiving contact tails from the connector.

Accordingly, the conductive elements inside the connector may have transition regions at either or both ends. In a transition region, a conductive element may jog out of the plane parallel to the wide dimension of the conductive element. In some embodiments, each transition region may have a jog toward the transition region of the other conductive element. In some embodiments, the conductive elements will each jog toward the plane of the other conductive element such that the ends of the transition regions align in a same plane that is parallel to, but between the planes of the individual conductive elements. To avoid contact of the transition regions, the conductive elements may also jog away from each other in the transition regions. As a result, the conductive elements in the transition regions may be aligned edge to edge in a plane that is parallel to, but offset from the planes of the individual conductive elements. Such a configuration may provide a balanced pair over a frequency range of interest, while providing routing channels within a printed circuit board that support a high density connector or while providing mating contacts on a pitch that facilitates manufacture of the mating contact portions.

In embodiments in which an edge-coupled configuration is employed at the intermediate portions of the signal conductors, the openings in the insulative support members may be positioned differently than for the broadside coupled configuration to ensure that the openings coincide with the regions of high electric field around the signal conductors. In some configurations, for example, the openings in the insulative support members may be preferentially configured between the signal conductors of the pair and encompassing the opposing edges of the pair, as well as portions of the first and/or second surfaces of the wide dimension of signal conductors adjacent those edges. In some embodiments, the portions of the first and second surfaces exposed may account for percentages of the surface as described above, such as for example, more than 25% or more than 50% in some embodiments. In such an embodiment, lateral support may also be provided at some locations along the length of the signal conductors. However, the lateral support may be between the edges of the edge-coupled signal conductors.

Although details of specific configurations of conductive elements, housings, and shield members are described above, it should be appreciated that such details are provided solely for purposes of illustration, as the concepts disclosed herein are capable of other manners of implementation. In that respect, various connector designs described herein may be used in any suitable combination, as aspects of the present disclosure are not limited to the particular combinations shown in the drawings.

Having thus described several embodiments, it is to be appreciated various alterations, modifications, and improvements may readily occur to those skilled in the art. Such alterations, modifications, and improvements are intended to be within the spirit and scope of the invention.

As one example, 50 millivolt signals were given as an example of low voltage differential signals. Low voltage signals may have a differential voltage of 2 Volts or less.

Accordingly, the foregoing description and drawings are by way of example only.

Manufacturing techniques may also be varied. For example, embodiments are described in which the daughtercard connector 600 is formed by organizing a plurality of wafers onto a stiffener. It may be possible that an equivalent structure may be formed by inserting a plurality of shield pieces and signal receptacles into a molded housing.

As another example, connectors are described that are formed of modules, each of which contains one pair of signal conductors. It is not necessary that each module contain exactly one pair or that the number of signal pairs be the same in all modules in a connector. For example, a 2-pair or 3-pair modules may be formed. Moreover, in some embodiments, a core module may be formed that has two, three, four, five, six, or some greater number of rows in a single-ended or differential pair configuration. Each connector, or each wafer in embodiments in which the connector is waferized, may include such a core module. To make a connector with more rows than are included in the base module, additional modules (e.g., each with a smaller number of pairs such as a single pair per module) may be coupled to the core module.

Furthermore, although many inventive aspects are shown and described with reference to a daughterboard connector having a right angle configuration, it should be appreciated that aspects of the present disclosure is not limited in this regard, as any of the inventive concepts, whether alone or in combination with one or more other inventive concepts, may be used in other types of electrical connectors, such as backplane connectors, cable connectors, stacking connectors, mezzanine connectors, I/O connectors, chip sockets, etc.

In some embodiments, contact tails were illustrated as press fit "eye of the needle" compliant sections that are designed to fit within vias of printed circuit boards. However, other configurations may also be used, such as surface mount elements, spring contacts, solderable pins, etc., as aspects of the present disclosure are not limited to the use of any particular mechanism for attaching connectors to printed circuit boards.

The present disclosure is not limited to the details of construction or the arrangements of components set forth in the foregoing description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. An electrical connector module comprising:
   at least two conductors, each of the at least two conductors comprising:
      a first end and a second end; and
      an intermediate portion connecting the first end and the second end, the intermediate portion comprising a first edge and a second edge and a first side and a second side between the first edge and the second edge, the first and second sides being wider than the first and second edges, wherein the at least two conductors comprise a first conductor and a second conductor; and
   a support holding the first conductor adjacent the second conductor, the support having a first pedestal portion, a second pedestal portion, a third pedestal portion, and a fourth pedestal portion,
   wherein:
      the first pedestal portion contacts the first side of the first conductor, the second pedestal portion contacts the first side of the second conductor, the third pedestal portion contacts the second side of the first conductor, and the fourth pedestal portion contacts the second side of the second conductor, and, wherein:
      the second edge of the first conductor is held adjacent the first edge of the second conductor.

2. The electrical connector module of claim 1, wherein the first pedestal portion and the fourth pedestal portion have widths less than widths of the first and second sides of the first and second conductors.

3. The electrical connector module of claim 1, wherein:
   the support comprises openings; and
   the first edge and the second edge of the first and second conductors are disposed within the openings.

4. The electrical connector module of claim 3, wherein:
   the first and second sides of the first and second conductors have a first width; and
   the first and second edges of the first and second conductors each extend into the openings by a distance equal to at least 10% of the first width.

5. The electrical connector module of claim 3, wherein:
   the first side and the second side of the first conductor and the second conductor are at least partially exposed within the openings.

6. The electrical connector module of claim 1, wherein the first conductor and the second conductor are held within the support with the first and second sides of the first conductor parallel to the first and second sides of the second conductor.

7. The electrical connector module of claim 2, wherein the support comprises:
   a first member comprising the first pedestal portion and the second pedestal portion; and
   a second member comprising the third pedestal portion and the fourth pedestal portion.

8. The electrical connector module of claim 7, wherein:
   the first member comprises a first end and a second end and a compliant portion between the first end and the second end; and
   the first pedestal portion and the second pedestal portion extend from the compliant portion.

9. The electrical connector module of claim 8, further comprising:
   at least one fourth member around the support, the at least one fourth member pressing the compliant portion of the first member towards the second member such that the first conductor is pinched between the first pedestal portion and the second pedestal portion.

10. The electrical connector module of claim 9, wherein:
    the at least one fourth member comprises two joined metal members that collectively encircle the first member and the second member of the support.

11. The electrical connector module of claim 10, wherein the first and second signal conductors are an edgeside coupled pair of signal conductors and the at least one fourth member forms a shield around the edgeside coupled pair.

12. The electrical connector module of claim 11, wherein:
    the first ends of the first and second signal conductors comprise mating contact portions; the second ends of the first and second signal conductors comprise contact tails; and the mating contact portions and the contact tails extend from the support.

13. The electrical connector module of claim 12, wherein a subassembly includes at least two conductors, a support, and a fourth member, further comprising a wafer including:
    a plurality of lossy members coupled to the first shield member and/or the second shield member; and
    a plurality of subassemblies disposed within the wafer.

14. The electrical connector module of claim 13, wherein a plurality of wafers are aligned in parallel to form an electrical connector.

15. An electrical connector module comprising:
    at least two conductors, each of the at least two conductors comprising:
       a first end and a second end; and
       an intermediate portion connecting the first end and the second end, the intermediate portion comprising a first edge and a second edge and a first side and a second side between the first edge and the second edge, wherein the at least two conductors comprise a first conductor and a second conductor; and
    an insulative support holding the first conductor adjacent the second conductor,
    wherein:
       the two conductors are configured to produce an electric field pattern when carrying a differential signal at a frequency of 40 GHz having regions of higher field strength than adjacent regions; and
       the insulative support is configured to provide openings in the regions of higher field strength.

16. The electrical connector module of claim 15, wherein the first conductor and the second conductor are held within the insulative support with the first and second sides of the first conductor aligned with the first and second sides of the second conductor.

17. The electrical connector module of claim 16, wherein the first and second signal conductors are an edge coupled pair of signal conductors.

18. The electrical connector module of claim 15, wherein:
    the insulative support comprises:

a first member comprising a first pedestal portion and a third pedestal portion; and a second member comprising a second pedestal portion and a fourth pedestal portion, and the first pedestal portion contacts the first side of the first conductor, the second pedestal portion contacts the second side of the first conductor, the third pedestal portion contacts the first side of the second conductor, the fourth pedestal portion contacts the second side of the second conductor.

19. The electrical connector module of claim 15, further comprising a shield around the insulative support, wherein the shield comprises a first shield member and a second shield member that collectively encircle the insulative support.

20. An electrical connector comprising:

a plurality of wafers aligned in parallel, each of the wafers comprising a plurality of electrical connector modules, each of the electrical connector modules comprising:

at least two conductors, each of the at least two conductors comprising:

a first end and a second end; and an intermediate portion connecting the first end and the second end, the intermediate portion comprising a first edge and a second edge and a first side and a second side between the first edge and the second edge, wherein the at least two conductors comprise a first conductor and a second conductor;

an insulative support holding the first conductor adjacent the second conductor, the insulative support comprising a first pedestal portion, a second pedestal portion, a third pedestal portion, and a fourth pedestal portion; and a shield around the insulative support, wherein the shield comprises a first shield member and a second shield member that collectively encircle the insulative support wherein:

the first pedestal portion contacts the first side of the first conductor, the second pedestal portion contacts the second side of the first conductor, the third pedestal portion contacts the first side of the second conductor, the fourth pedestal portion contacts the second side of the second conductor; and at least one lossy member coupled to the first shield member and/or the second shield member of each of the plurality of electrical connector modules.

* * * * *